United States Patent [19]

Peters et al.

[11] Patent Number: 4,606,025

[45] Date of Patent: Aug. 12, 1986

[54] AUTOMATICALLY TESTING A PLURALITY OF MEMORY ARRAYS ON SELECTED MEMORY ARRAY TESTERS

[75] Inventors: Robert M. Peters, Wappingers Falls; Henri D. Schnurmann, Monsey; Louis J. Vidunas, Wappingers Falls, all of N.Y.

[73] Assignee: International Business Machines Corp., Armonk, N.Y.

[21] Appl. No.: 536,597

[22] Filed: Sep. 28, 1983

[51] Int. Cl.$^4$ .............................................. G06F 31/28
[52] U.S. Cl. .................................. 371/20; 324/73 R; 371/21
[58] Field of Search ................. 371/20, 21; 324/73 R, 324/73 AT; 364/579, 580

[56] References Cited

U.S. PATENT DOCUMENTS

| | | | |
|---|---|---|---|
| 3,733,587 | 5/1973 | Lloyd et al. | 364/200 |
| 4,044,244 | 8/1977 | Foreman et al. | 371/20 |
| 4,055,801 | 10/1977 | Pike et al. | 324/73 R |
| 4,108,358 | 8/1978 | Niemaszyk et al. | 371/20 |
| 4,168,527 | 9/1979 | Winkler | 364/580 |
| 4,335,436 | 6/1982 | Inoue | 364/474 |
| 4,402,055 | 8/1983 | Lloyd et al. | 364/579 |

OTHER PUBLICATIONS

IBM TDB, vol. 20, No. 8, Jan. 1978, "Generalized Data Entry System for Creating, Storing and Cataloguing Test Data Specification", R. M. Peters & H. D. Schnurmann, pp. 3147–3150.

IBM TDB, vol. 21, No. 7, Dec. 1978, "Release Test System for Special Part Numbers", H. D. Schnurmann, pp. 2798–2800.

IBM TDB, vol. 21, No. 12, May 1979, "Technology/Tester Independent Query Syntax for the Interactive Technology Library Generator", R. M. Peters and H. D. Schnurmann, pp. 4861–4863.

IBM TDB, vol. 25, No. 5, Oct. 1982, "Screen Image Rule Generation System for Test Data Specification System", G. O. Hughes, R. M. Peters, H. D. Schnurmann, and L. J. Vidunas, pp. 2304–2319.

IBM TDB, vol. 25, No. 5, Oct. 1982, "Engineering Data Entry System for Automatic Generation of Array Test Programs", L. J. Clark, G. A. DeLuca, R. M. Peters, H. D. Schnurmann & L. J. Vidunas, pp. 2316–2319.

Millham et al., Logical Assembly Testing System, IBM Technical Disclosure Bulletin, vol. 14, No. 11, Apr. 1972, pp. 3446–3449.

Ring, A Distributed Intelligence Automatic Test System for Patriot, IEEE Trans. on Aerospace and Electronic Systems, vol. AES-13, No. 3, May 1977, pp. 264–272.

*Primary Examiner*—Charles E. Atkinson
*Attorney, Agent, or Firm*—Robert J. Haase

[57] ABSTRACT

A system for automatically testing a plurality of memory arrays on selected memory array testers includes an interactive data entry device for entering array test specifications including characterizing information, DC testing parameters, AC testing parameters and AC test pattern choices for the array. The test specifications are entered in a format which is independent of a particular tester's characteristics. A universal language generator generates a tester independent universal language instruction sequence for carrying out the prescribed tests based upon the entered test specifications. Associated with each tester is a universal language translator which translates the tester independent universal language instruction sequence into an instruction sequence which is particular to the associated tester. The tester dependent instruction sequence may be loaded into the associated tester to produce the test signals for testing the memory array.

36 Claims, 22 Drawing Figures

AC ARRAY LIBRARY ALLOCATIONS SCREEN

```
    ENTER PARAMETERS BELOW:

TECHNOLOGY           ⟶   _____      (3 CHARACTERS)

PRODUCT TYPE         ⟶   _____      (WAFER, MODULE)

PART NUMBER          ⟶   _____

ENGINEERING CHANGE LEVEL  ⟶   _____

OF WORD ADDRESSES       ⟶   _____

OF BIT ADDRESSES        ⟶   _____

OF DATA LINES           ⟶   _____

OF CONTROL LINES        ⟶   _____

DESIGN               ⟶   _____      (INTERWOVEN OR NON
                                              INTERWOVEN)

DISPOSITION          ⟶   _____      (NEW, MOD, OR OLD)
```

FIG. 3C

DC TEST DATA ENTRY SCREEN

```
PROJECT  ⟶  _____      (6 CHARACTER USER IDENTIFI-
                              CATION

LIBRARY  ⟶  _____      (TEST PROGRAM NAME, SEE BELOW)

MEMBER   ⟶  _____      (BLANK FOR SELECTION LIST)

TEST PROGRAM NAME GENERATION:

THE TEST PROGRAM NAME IS GENERATED BY SUBSTITUTING THE
FOLLOWING

XXX - TECHNOLOGY
          Z - FIRST LETTER OF PRODUCT TYPE
          S - EC SUFFIX LEVEL
```

FIG. 3D

SUPPLY MENU SCREEN

```
     TOTAL # OF POWER SUPPLY CASES _____ (2 DIGITS)

POWER SUPPLY CASE # _____ (2 DIGITS)

V/I CARD: ─────▶      $V_{CC}$      $V_{BB}$     $V_{EE}$      $V_{11}$       $V_{22}$

GROUP 1   ─────▶

GROUP 2   ─────▶

PSCLAMP   ─────▶       2V           -2V          -2V

PS RANGE  ─────▶       1A            1A           1A

MODE                STANDARD      STANDARD    STANDARD

NOTE: MODE = STANDARD, DUAL OR MULTIPLE)

I/O DEFAULTS:

I/O CLAMP ─────▶ 10V

I/O RANGE ─────▶ 10MA  (10μA, 100μA, 1MA, 10MA, 100MA)
```

FIG. 3E

DC TEST SITE LIMITS MENU SCREEN

```
TEST NAME      ⟶
PIN (POS)      ⟶              PIN (NEG)        ⟶
MAX LIMIT      ⟶              MIN LIMIT        ⟶
DIAGNOSTIC #   ⟶   01         POWER SUPPLY CASE #  ⟶

EMITTER              BASE                COLLECTOR
PIN    VALUE         PIN    VALUE         PIN   VALUE
⟶      ⟶             ⟶      ⟶             ⟶     ⟶

OTHER CONDITIONS FOR THIS TEST (MAZE, VIA, RESISTOR)

PIN    VALUE         PIN    VALUE         PIN   VALUE
⟶      ⟶             ⟶      ⟶             ⟶     ⟶
⟶      ⟶             ⟶      ⟶             ⟶     ⟶
⟶      ⟶             ⟶      ⟶             ⟶     ⟶
```

FIG. 3G

AC TEST DATA ENTRY SCREEN

PROJECT ⟶ (6 CHARACTER USER IDENTIFICATION)

LIBRARY ⟶ (TEST PROGRAM NAME, SEE BELOW)

MEMBER ⟶ (BLANK FOR SELECTION LIST)

TEST PROGRAM NAME GENERATION:

THE TEST PROGRAM NAME IS GENERATED BY SUBSTITUTING THE FOLLOWING

XXX - TECHNOLOGY

Z - FIRST LETTER OF PRODUCT TYPE

S - EC SUFFIX LEVEL

FIG. 3H

FOREGROUND PROCESSING SCREEN

SCREEN IMAGE ENTRY SOURCE

PROJECT ⟶ (6 CHARACTER USER IDENTIFICATION)

LIBRARY ⟶ (TEST PROGRAM NAME, SEE BELOW)

TEST PROGRAM NAME GENERATION:

THE TEST PROGRAM NAME IS GENERATED BY SUBSTITUTING THE FOLLOWING:

XXX - TECHNOLOGY

Z - FIRST LETTER OF PRODUCT TYPE

S - EC SUFFIX LEVEL

FIG. 3K

BACKGROUND PROCESSING SCREEN

```
       SCREEN IMAGE ENTRY SOURCE

PROJECT    ⟶         (6 CHARACTER, USER IDENTIFICATION)

LIBRARY    ⟶         (TEST PROGRAM NAME, SEE BELOW)

OPTIONS:

DC UNIVERSAL LANGUAGE GENERATION    ⟶    (YES/NO)

AC UNIVERSAL LANGUAGE GENERATION    ⟶    (YES/NO)

TESTER    ⟶

DC TEST INSTRUCTION SET             ⟶    (YES/NO)

AC TEST INSTRUCTION SET             ⟶    (YES/NO)

TEST PROGRAM NAME GENERATION:

THE TEST PROGRAM NAME IS GENERATED BY SUBSTITUTING THE
FOLLOWING:

XXXX - TECHNOLOGY
        Z - FIRST LETTER OF PRODUCT TYPE
        S - EC SUFFIX
```

FIG. 3L

BIT PATTERN GENERATION DATA

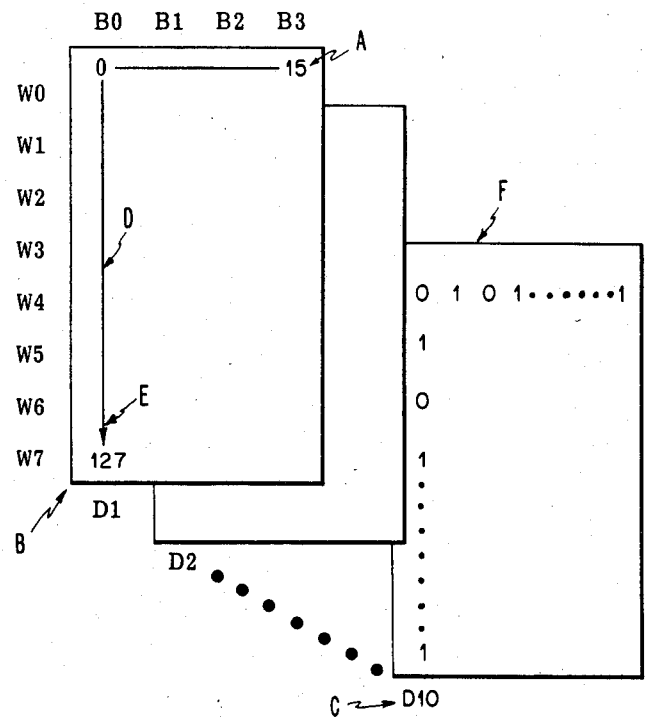

| | Information | | Origin |
|---|---|---|---|
| A | NUMBER OF BIT ADDRESS LINES ( 4 ) | DIMEN: | AC UNIVERSAL LANGUAGE STATEMENT (TABLE 4) |
| B | NUMBER OF WORD ADDRESS LINES ( 7 ) | DIMEN: | AC UNIVERSAL LANGUAGE STATEMENT (TABLE 4) |
| C | NUMBER OF DATA LINES (10) | DIMEN: | AC UNIVERSAL LANGUAGE STATEMENT (TABLE 4) |
| D | ADDRESSING PRIORITY (WORD) | WRITE: | AC UNIVERSAL LANGUAGE STATEMENT (TABLE 4) |
| E | ADDRESSING DIRECTION (INCREMENTAL) | WRITE: | AC UNIVERSAL LANGUAGE STATEMENT (TABLE 4) |
| F | TYPE OF PATTERN (CHECKERBOARD - 0) | WRITE: | AC UNIVERSAL LANGUAGE STATEMENT (TABLE 4) |

FIG. 10

CHECKERBOARD BIT PATTERNS

| A-MEM WORD # | A-MEM DATA BITS 1-10 | A-MEMORY BLOCK WRITE | BLOCK READ | INCB | BRNA | PTR CYCLE | CYCLE | WORD LINES 0-6 | BIT LINES 0-3 | STR | B-MEMORY SEL | PAS | B-MEM WORD # | (WORD,BIT) |
|---|---|---|---|---|---|---|---|---|---|---|---|---|---|---|
| 0 | 0-0 | 1 | 1 |   |   |   |   |   | 0000 |   |   |   |   | DUMMY |
| 1 | 0-0 | 0 | 0 | 1 | 1 | 0 | 0 | 0000000 |   | 0 | 0 | 0 | 0 | (0,0) |
| 2 | 1-1 | 0 | 1 | 1 | 1 | 1 | 1 | 0000001 |   | 0 | 0 | 0 | 0 | (1,0) |
| 1 | 0-0 | 0 | 1 | 1 | 0 | 0 | 0 | 0000010 |   | 0 | 0 | 0 | 1 | (2,0) |
| 2 | 1-1 | 0 | 1 | 1 | 1 | 0 | 0 | 0000011 |   | 0 | 0 | 0 | 3 | (3,0) |
| ... |   |   |   |   |   |   |   |   |   |   |   |   |   |   |
| 1 | 0-0 | 0 | 1 | 1 | 1 | 0 | 0 | 1111110 | 0000 | 1 | 0 | 1 | 126 | (126,0) |
| 2 | 1-1 | 0 | 1 | 1 | 0 | 0 | 1 | 1111111 |   | 0 | 0 | 0 | 127 | (127,0) |
| 3 | 1-1 | 0 | 1 | 1 | 1 | 0 | 1 | 0000000 | 0001 | 0 | 0 | 0 | 128 | (0,1) |
| 4 | 0-0 | 0 | 1 | 1 | 0 | 0 | 0 | 0000001 |   | 0 | 0 | 0 | 129 | (1,1) |
| 3 | 1-1 | 0 | 1 | 1 | 1 | 0 | 1 | 0000010 |   | 0 | 0 | 0 | 130 | (2,1) |
| 4 | 0-0 | 0 | 1 | 1 | 0 | 0 | 0 | 0000011 |   | 0 | 0 | 0 | 131 | (3,1) |
| ... |   |   |   |   |   |   |   |   |   |   |   |   |   |   |
| 3 | 1-1 | 0 | 1 | 1 | 1 | 0 | 1 | 111110 | 0001 | 1 | 0 | 1 | 254 | (126,1) |
| 4 | 0-0 | 0 | 1 | 1 | 0 | 0 | 0 | 1111111 |   | 0 | 0 | 0 | 255 | (127,1) |
| ...8 | 0-0 | 0 | 1 | 1 | 1 | 0 | 0 | 1111111 | 0011 | 0 | 0 | 0 | 255 | (127,3) |
| ...12 | 0-0 |   |   |   |   |   |   |   | 0101 |   |   |   |   | (127,5) |
| ...16 | 0-0 |   |   |   |   |   |   |   | 0111 |   |   |   |   | (127,7) |
| ...20 | 0-0 |   |   |   |   |   |   |   | 1001 |   |   |   |   | (127,9) |
| ...24 | 0-0 |   |   |   |   |   |   |   | 1011 |   |   |   |   | (127,11) |
| ...28 | 0-0 |   |   |   |   |   |   |   | 1101 |   |   |   |   | (127,13) |
| ...32 | 0-0 |   |   |   |   |   |   |   | 1111 |   |   |   |   | (127,15) |

FIG. 11

AUTOMATICALLY TESTING A PLURALITY OF MEMORY ARRAYS ON SELECTED MEMORY ARRAY TESTERS

BACKGROUND OF THE INVENTION

1. Technical Field

This invention relates to the testing of integrated circuit memories and more particularly to automatic generation of a customized test program for testing a memory array on a selected tester.

Integrated circuit memory arrays are widely used for storing data in data processing systems. As is well known to those skilled in the art, an integrated circuit memory typically comprises a plurality of memory cells arranged in an array or matrix having a predetermined number of rows and columns, with one data bit being stored per cell. Data is typically written into or read from the array by addressing one or more cells and reading or writing the desired data.

2. Background Art

In the current state of the art, two hundred fifty-six thousand or more cells may be integrated on a single semiconductor substrate. Such arrays present extreme problems in the testing environment.

Among the tests typically performed on an array are DC parametric tests, AC parametric tests and AC pattern tests. DC parametric tests relate to static electrical properties such as voltage or current limits for the array cells and connecting lines. DC parametric tests may be performed on integrated circuits having interconnected memory cells thereon, (i.e., product tests) or on integrated circuits having unconnected devices thereon (i.e., test site tests). AC parametric tests relate to dynamic electrical properties such as minimum bit/word address access time, and minimum cell switching transition times. AC pattern tests read and write various well known test patterns into the array to ensure that each cell is functioning properly and is not disturbed by operations performed on other cells. Examples of well known AC pattern tests are walking 1's, marching 1's, or checkerboard pattern tests. Memory testers typically include a tester memory for storing therein an instruction sequence representing all of the tests to be performed on the array, and a tester pattern generator for generating the appropriate address, control and data signals from the stored instruction sequence in the tester memory.

From the above description it will be appreciated that for a large array, generation of the requisite tester memory instruction sequences is inordinately complex and time consuming. The instruction sequences for the tester memory must be created and debugged manually, a process that may take weeks when dealing with a two hundred fifty-six thousand bit array. Moreover, in order to properly generate the instruction sequence, the test designer must be intimately familiar with the configuration of the tester being employed and the instruction set therefor. Further, an array manufacturing facility may often employ a number of different memory testers each having different instruction sets. Memory test data must be created anew when another tester is employed, since there is usually no software compatibility even between different types of memory testers from the same manufacturer. Accordingly, additional weeks of test generation and debugging may be required when it is desired to add or change testers array.

State of the art memory testers have attempted to alleviate some of the manual work of creating an appropriate tester instruction sequence by designing the tester to accept a higher level instruction set. However, such high level instructions are still tester dependent, i.e., they are particular to a given tester. Thus, the test designer must be intimately familiar with the high level instruction set for each tester being employed. Moreover, the high level instruction sequence that defines the test program must be created anew when a different tester is employed. Accordingly, while the high level language provisions of state of the art memory testers have eliminated some of the more tedious work, they have not solved the problems faced in a manufacturing environment which must test many array types on a plurality of different array testers.

DISCLOSURE OF INVENTION

It is therefore a primary object of the invention to provide a method and apparatus for automatically testing a plurality of memory arrays on selected memory array testers.

It is a further object of the invention to provide a method and apparatus for automatically testing a plurality of memory arrays on selected memory array testers wherein the test designer need not know the hardware configuration or the instruction set employed by the tester.

It is a further object of the invention to provide an automatic method of generating instruction sequences for a particular memory array in a particular tester matter of hours rather than weeks.

It is a yet further object of the invention to provide a method and apparatus for automatically testing a plurality of memory arrays on selected memory array testers, the method and apparatus being usable on any of a number of memory testers and being expandable to new memory testers as they become available.

These and other objects are provided by an array test system which includes an interactive data entry device upon which menus are presented for entering test specifications which may include characterizing information, DC testing parameters, AC testing parameters, and/or AC test pattern choices for the array to be tested. The characterizing information, DC testing parameters, AC testing parameters and AC test pattern choices are specified by the memory designer in an array test specification document and are entered into the interactive data entry device in a format which is independent of individual tester characteristics. Means are provided for automatically auditing the entered test specifications, to ensure the consistency and completeness thereof.

The array test system of the present invention also includes a universal language generator which generates tester independent instructions for carrying out the prescribed DC parametric tests, AC parametric tests, and/or AC pattern tests based upon the test specifications which were entered into the interactive data entry device. The generated universal language instruction sequence is independent of the characteristics of an individual memory tester. Finally, associated with each tester is a universal language translator which translates the tester independent, universal language instruction sequence into an instruction sequence which is particular to the associated tester, for carrying out the specified DC parametric tests, AC parametric tests and/or AC pattern tests thereon. The universal language instruction sequence is routed to the translator associated with the tester to be employed, where the universal language instruction sequence is translated into the requisite tester dependent instruction sequence. The translated tester dependent instructions are entered into the tester memory for producing the test signals which are used to test the array.

Since the apparatus of the present invention automatically generates the instruction sequences for testing a particular array on a given tester from a high level tester independent description, a set of memory test patterns may be generated in hours and not weeks. Moreover, the user need not understand the hardware configuration or instruction set for the particular tester to be employed. Finally, an array can easily be tested on another tester by translating the universal language instruction sequence for the array using the universal language translator associated with another tester. When new testers become available, a new translator merely need be made therefor in order to integrate that memory tester into the automatic memory test signal generating system.

In a preferred embodiment, the interactive data entry device is a display terminal, e.g., an IBM 3277, upon which appear menus for prompted entry of characterizing information, DC testing parameters, AC testing parameters and AC test pattern choices for the particular array. A data entry manager program within a host data processor, e.g. an IBM 3033 controls the interactive data entry. The universal language generator is a computer program, which may reside in the same host processor, for generating the tester independent instruction sequence from the interactively entered tester independent information and parameters. The translators each comprise a computer program, which may reside in the same host data processor or another data processor, for translating the universal language instruction sequence into an appropriate tester dependent instruction sequence.

The method of testing arrays according to the present invention includes the steps of operating one or more computers to perform the following operations:

1. Presenting menus on an interactive data entry device for entry therein of characterizing information, DC testing parameters, AC testing parameters and AC test pattern choices for the array to be tested;

2. Verifying the accuracy and completeness of the entered information, and alerting the operator of any incomplete/inaccurate information;

3. Generating a universal, tester independent instruction sequence based upon the entered information; and 4. Translating the universal language instruction sequence into a tester dependent instruction sequence for the particular array tester to be employed.

BRIEF DESCRIPTION OF THE DRAWING

FIG. 10 illustrates bit pattern generation data employed by the translator of FIG. 8.

FIG. 11 illustrates a typical checkerboard bit pattern generated by the translator of FIG. 8.

BEST MODE FOR CARRYING OUT THE INVENTION OVERALL SYSTEM ARCHITECTURE AND METHODOLOGY

Figure 1:
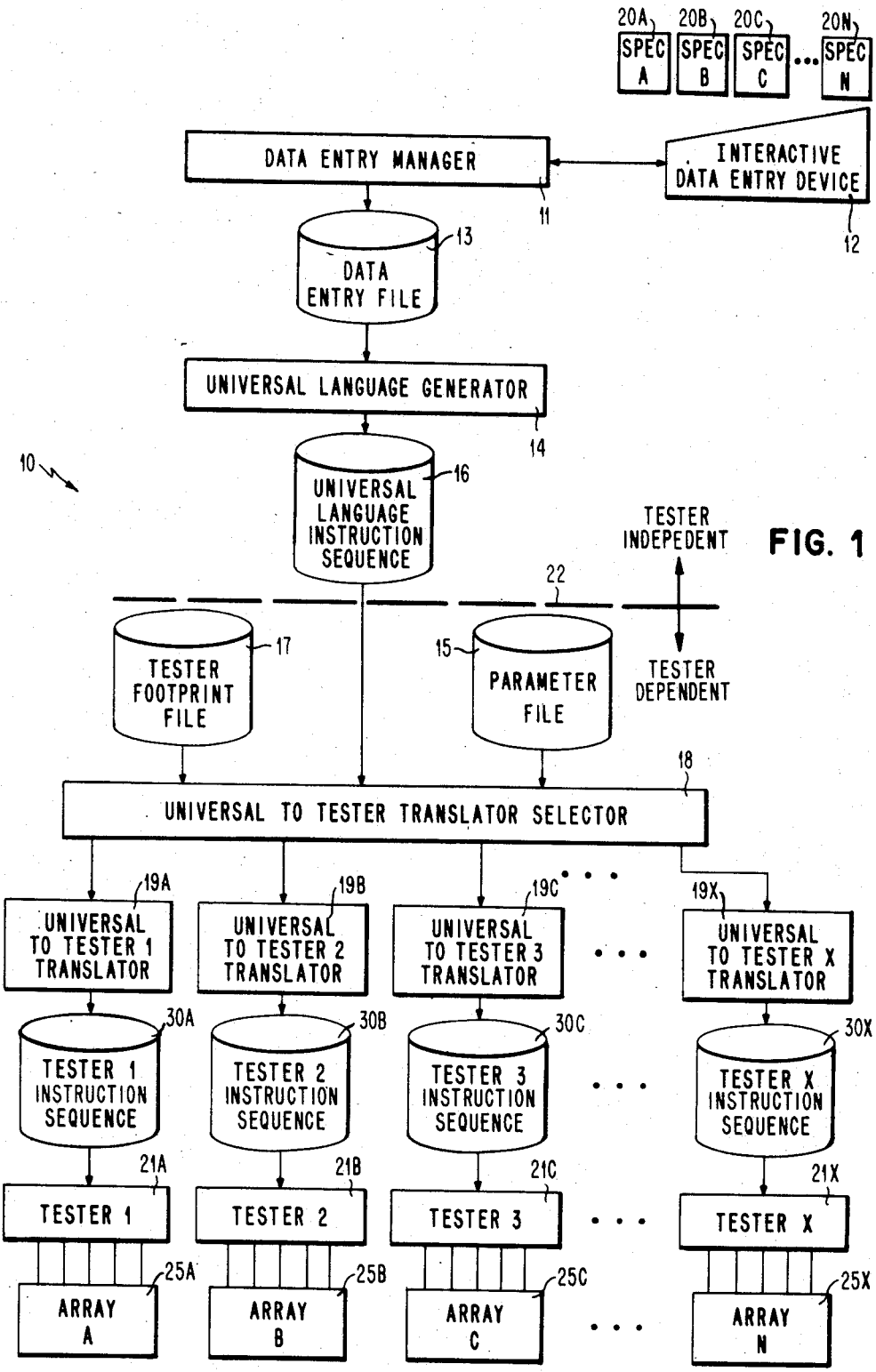
FIG. 1 illustrates the overall architecture employed for automatically testing selected memory arrays on selected memory array testers according to the present invention.

Referring now to FIG. 1, there is illustrated the overall system architecture and methodology for automatically testing a plurality of memory arrays on selected memory array testers. The system 10 includes an interactive data entry device 12 for entering therein array test specifications, which may include characterizing information, DC testing parameters, AC testing parameters and/or AC test pattern choices for the particular memory array $25a \ldots 25x$ to be tested. This information may be found in the memory test specification document $20a \ldots 20n$ for the array to be tested.

Data entry manager program 11 resides in a host computer to which interactive data entry device 12 is connected. Data entry manager 11 is employed for presenting menus on interactive data entry device 12 and for placing data entered thereby into data entry file 13. The data in entry file 13 characterizes the memory and the tests to be performed thereon and is independent of any particular tester configuration. The data from entry file 13 is configured into a universal, tester independent language sequence 16 by universal language generator 14.

The universal language sequence 16 is then applied to the appropriate one of the plurality of universal to tester translators $19a \ldots 19x$ one of which exists for each tester $21a \ldots 21x$ which is employed for testing an array $25a \ldots 25x$ thereon. Universal to tester translator selector 18 applies the universal language sequence 16 to the appropriate translator $19a \ldots 19x$ in accordance with tester routing data contained in parameter file 15. Each universal to tester translator $19a \ldots 19x$ can translate the tester independent universal language sequence 16 into a tester dependent instruction sequence $30a \ldots 30x$. The tester instruction sequences $30a \ldots 30x$ are applied to the tester memory of associated tester $21a \ldots 21x$. The tester instruction sequences are used by the tester pattern generator to generate the test signals for carrying out the appropriate DC parametric, AC parametric and AC pattern tests.

Examination of FIG. 1 shows that any one of arrays $a \ldots n$ may be tested on any one of testers $1 \ldots x$ without the need for regenerating the test data. Rather, the universal language instruction sequence is merely applied to the appropriate universal to tester translator 19 for generating the appropriate tester instruction sequence 30. Moreover, since all of the processing above line 22 is tester independent, the user at interactive data entry device 12 need not known anything about a particular tester configuration or instruction set. He need merely enter the appropriate data from the memory test specification 20 into interactive data entry device 12 as prompted by data entry manager 11. Finally, a new tester may be added by generating a new universal to tester translator 19 for interfacing the added tester with the universal language instruction sequence.

FIG. 1 also outlines the method of automatically testing the selected memory array 25 on a selected tester 21. The memory characterizing and test data is entered via interactive data entry device 12 and a universal language representation thereof is generated by universal language generator 14. The universal language instruction sequence is then applied to the appropriate universal to tester translator 19 by universal to tester translator selector 18. The tester instruction sequence produced by the appropriate translator is then stored in the tester memory and used to generate the test signals for testing array 25.

In succeeding sections of this specification, each of the components of FIG. 1 will be described in sufficient detail so as to enable those skilled in the art to make and use automatic memory test system 10.

INTERACTIVE DATA ENTRY

Figure 2:
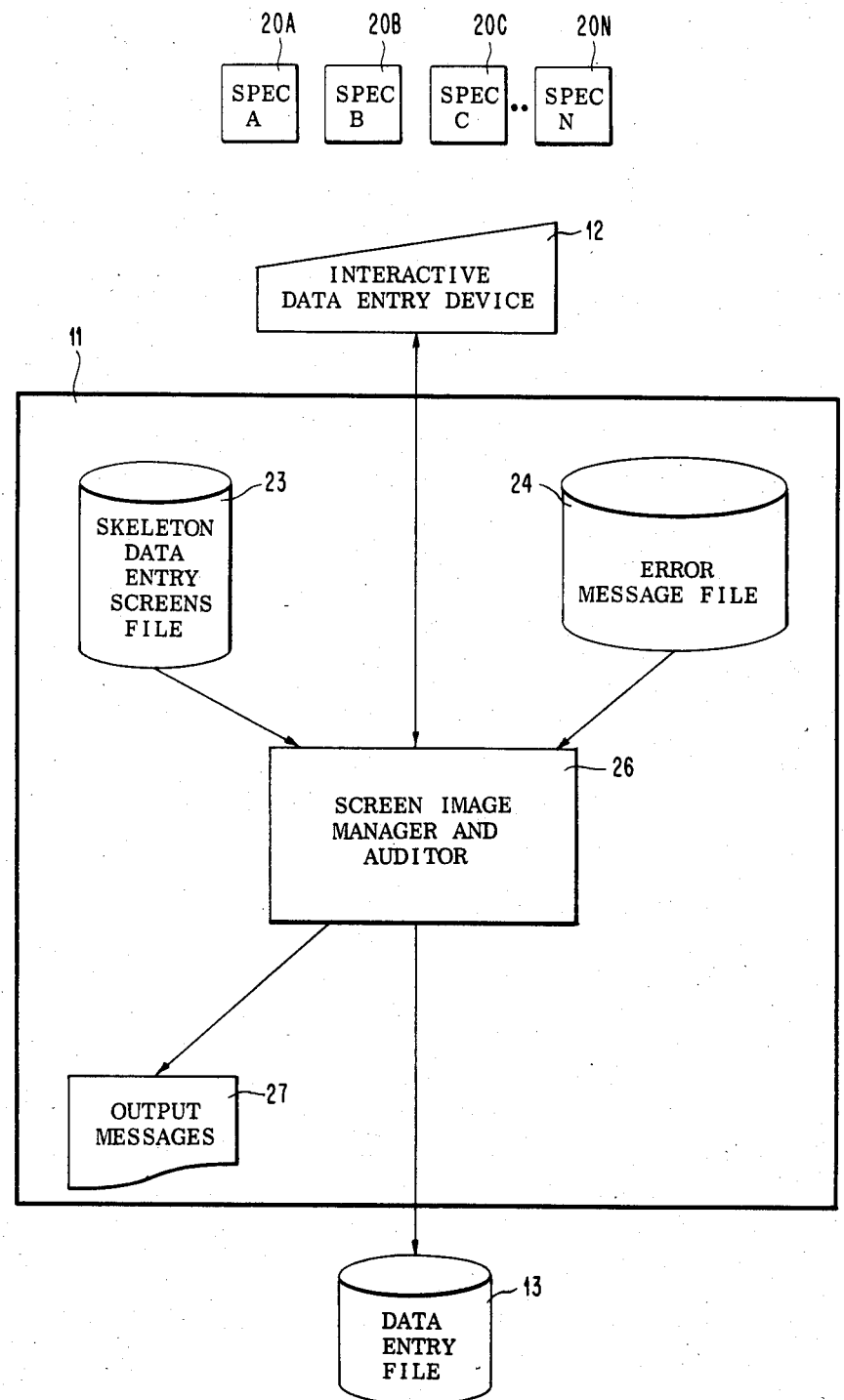
FIG. 2 illustrates the data entry manager employed in FIG. 1.

Referring now to FIG. 2, the details of data entry manager 11 will be described. Data entry manager 11 creates a data entry file 13 from data which is interactively entered by the user at interactive data entry device 12. As noted above, interactive data entry device 12 is a display terminal, e.g., an IBM 3277, which is connected to a host computer, e.g., an IBM 3033. A user interactively enters memory test data from the memory test specification 20 in a manner that will be illustrated in connection with FIGS. 3A-3L.

Referring again to FIG. 2, data entry manager 11 includes a screen image manager and auditor program 26 for controlling the data entry process by presenting the user with an appropriate display screen in a predetermined sequence to facilitate the interactive entry of characterizing information, DC testing parameters, AC testing parameters and AC test pattern choices for the particular array to be tested.

Screen image manager and auditor 26 employs two data bases in connection with this operation, i.e., skeleton data entry screens file 23 and error message file 24. Skeleton data entry screens file 23 is a representation of all of the screens which the screen image manager and auditor may present to a user. Some of the screens are pre-initialized to facilitate data entry as will described in connection with FIGS. 3A-3L. FIGS. 3A-3L illustrate all of the skeleton screens employed. Each of these screens and the fields contained therein will be described more particularly below.

A second function performed by the screen image manager and auditor 26 is auditing the interactively entered data for possible errors. These audits may be generally described as syntax audits and test specification audits.

Error message file 24 contains informational messages and audit error messages which may be presented to the user. If in auditing, an error is detected, an appropriate error message from the error message data base 24 will be dynamically flashed onto interactive data entry device 12. Table 1 contains a listing of error warning and informational messages employed, and a brief explanation of the meanings thereof. Output messages 27 are merely a hard copy of the error messages which are presented on interactive data device 12 during interactive data entry.

TABLE 1
ERROR WARNING AND INFORMATIONAL MESSAGES

| | |
|---|---|
| ERROR 1: | Product masterslice number must be 3 numeric digits. |
| Meaning: | Self-explanatory. |
| ERROR 2: | Product type is not "WAFER" or "MODULE" or "TEST SITE". |
| Meaning: | 1 of the 3 above choices must be selected. |
| ERROR 3: | Product footprint is not 11 × 11 or 17 × 17. |
| Meaning: | The only allowable pin grids programmed into the system are 11 × 11 and 17 × 17. |
| ERROR 4: | Tester _____ is not supported. |
| Meaning: | The current list of allowable testers are: _____ , _____ . |
| ERROR 5: | Invalid "PART # ID". |
| Meaning: | Self-explanatory. |
| ERROR 6: | Disposition must be "NEW" or "MOD" or "DEL" |
| Meaning: | Enter "NEW" if this is first session for this product and tester. Enter "MOD" if AC or DC data has already been entered and you want to concatenate the complementary data to it. Enter "DEL" to delete any existing data for this product and tester. |
| ERROR 7: | Test Name _____ is not known to the directory of tests. |
| Meaning: | Enter correct test site test name or update the directory of valid tests. |
| ERROR 8: | Delay value for Test Number _____ does not have unit-of-measure specified. |
| Meaning: | Specify either "MS" or "US" or "NS". |
| WARNING: | Test number _____ Range between MAX LIMIT value and MIN LIMIT value is greater than .5 volts/amp. |
| Meaning: | Insure pos/neg signs are consistent, and that values are correctly specified. |
| WARNING: | Test Name _____ Unit-of-measure are unequal between MAX LIMIT value and MIN LIMIT value. |
| Meaning: | Insure unit of measure denominations are correctly specified. |
| ERROR 9: | Test Name _____ MAX LIMIT and MIN values are reversed. |
| Meaning: | MAX LIMIT value is less than MIN LIMIT value. |
| ERROR 10: | Power supply "CASE #" or "NUMBER OF CASES" is not numeric. |
| Meaning: | Value must be 2-digit numeric. |
| ERROR 11: | Power Supply Case # _____ IOCLAMP value incorrectly specified. |
| Meaning: | Must be numeric value followed by: V or MV. |
| ERROR 12: | Power Supply Case # _____ IORANGE value is not legal. |
| Meaning: | Value must be selected from list provided. |
| INFO 1: | Universal Language Controller began operation. |
| Meaning: | Self-explanatory. |
| INFO 2: | DC Universal Language Generator began operation. |
| Meaning: | Self-explanatory. |
| INFO 3: | DC Universal Language Generator completed successfully. |
| Meaning: | Self-explanatory. |

The error and warning messages of Table 1 are employed by screen image manager and auditor 26 to audit the interactively entered data for completeness and consistency. ERROR 2 (Table 1) is an example of syntax error, which occurs when incorrect "PRODUCT TYPE" information is entered on the DC Array Library Allocation Screen (FIG. 3B). When ERROR 2 message flashes on the screen the user is required to re-enter the erroneous data. ERROR 10 (Table 1) exemplifies a specification error, which occurs when an unrecognized test site "TEST NAME" is entered on the DC Test Site Limits Menu Screen (FIG. 3G). An unrecognized test site "TEST NAME" may occur if the name was entered incorrectly (e.g., misspelled) or if the directory of test site tests needs to be updated so that the test may be recognized.

The array test data which is interactively entered under the control of screen image manager and auditor 26 is placed in data entry file 13. Data entry file 13 is a partitioned data set containing the interactively entered data organized as a collection of filled in skeleton screens.

Figure 3A:
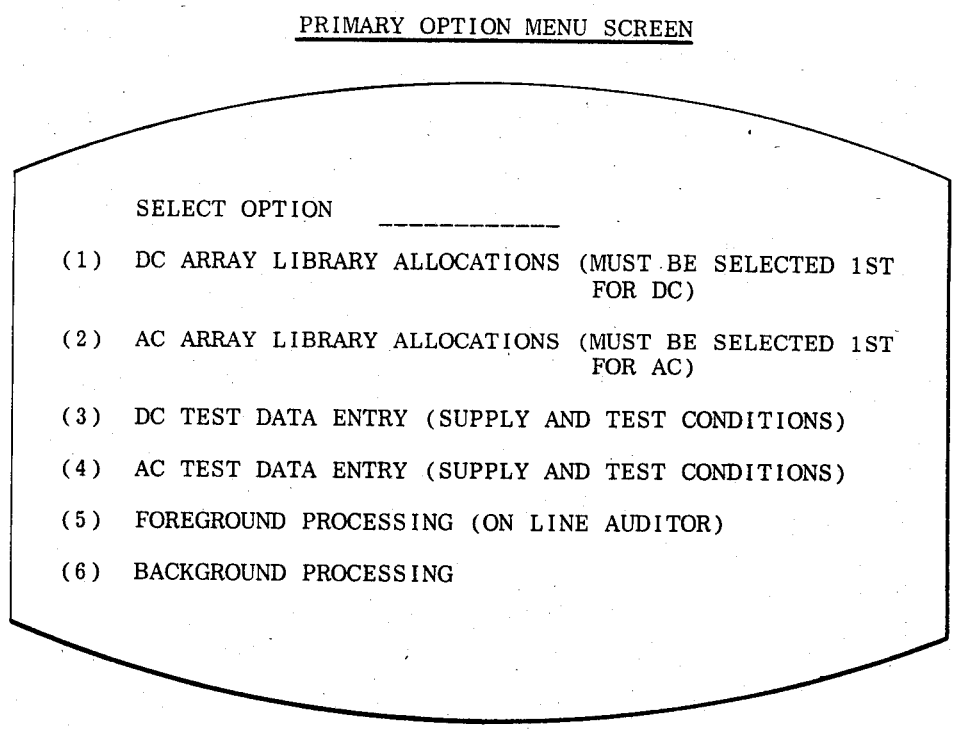
FIG. 3, comprised of FIGS. 3A–3L, illustrates sample interactive display screens for entering therein array characterizing information, DC testing parameters, AC testing parameters and AC test pattern choices.
Figure 3B:
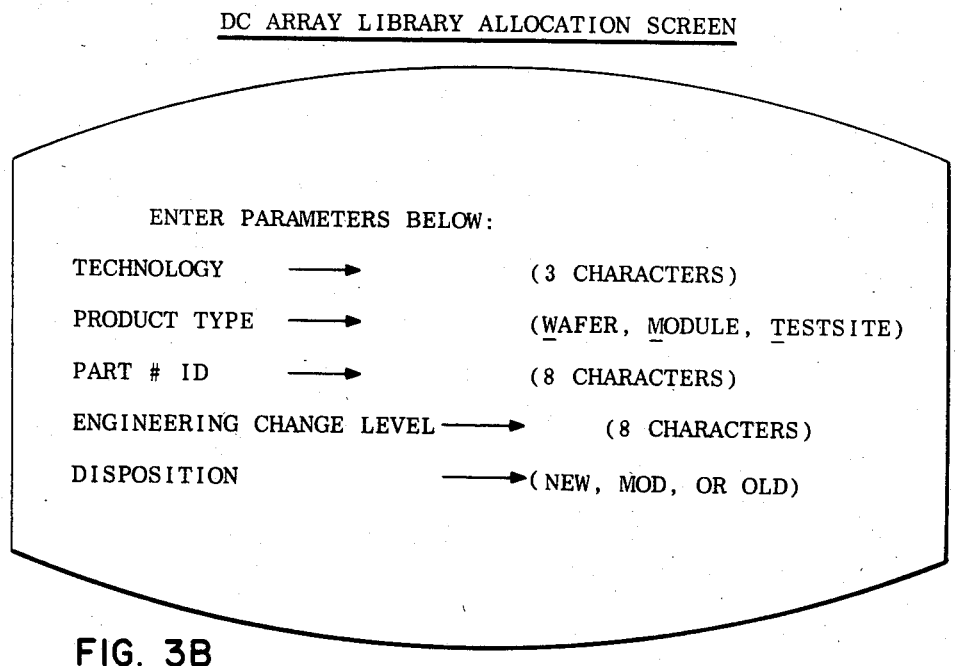
Figure 3F:
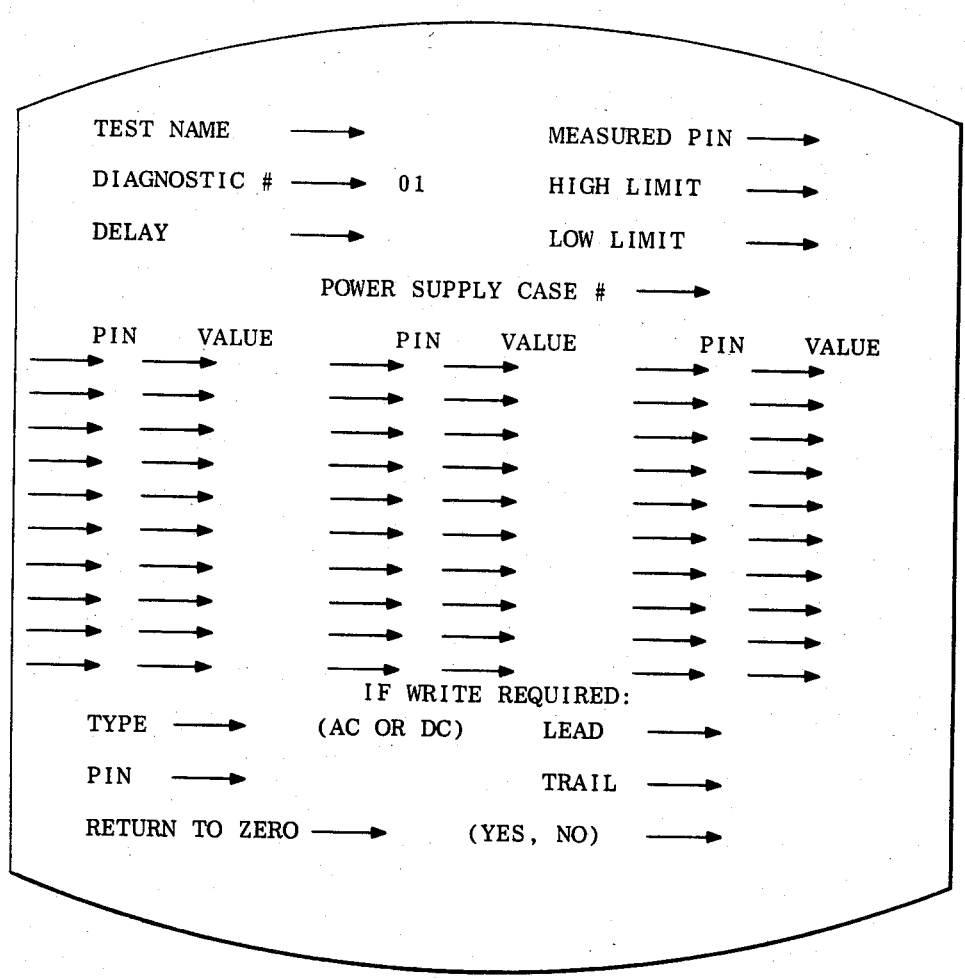
Figure 3I:
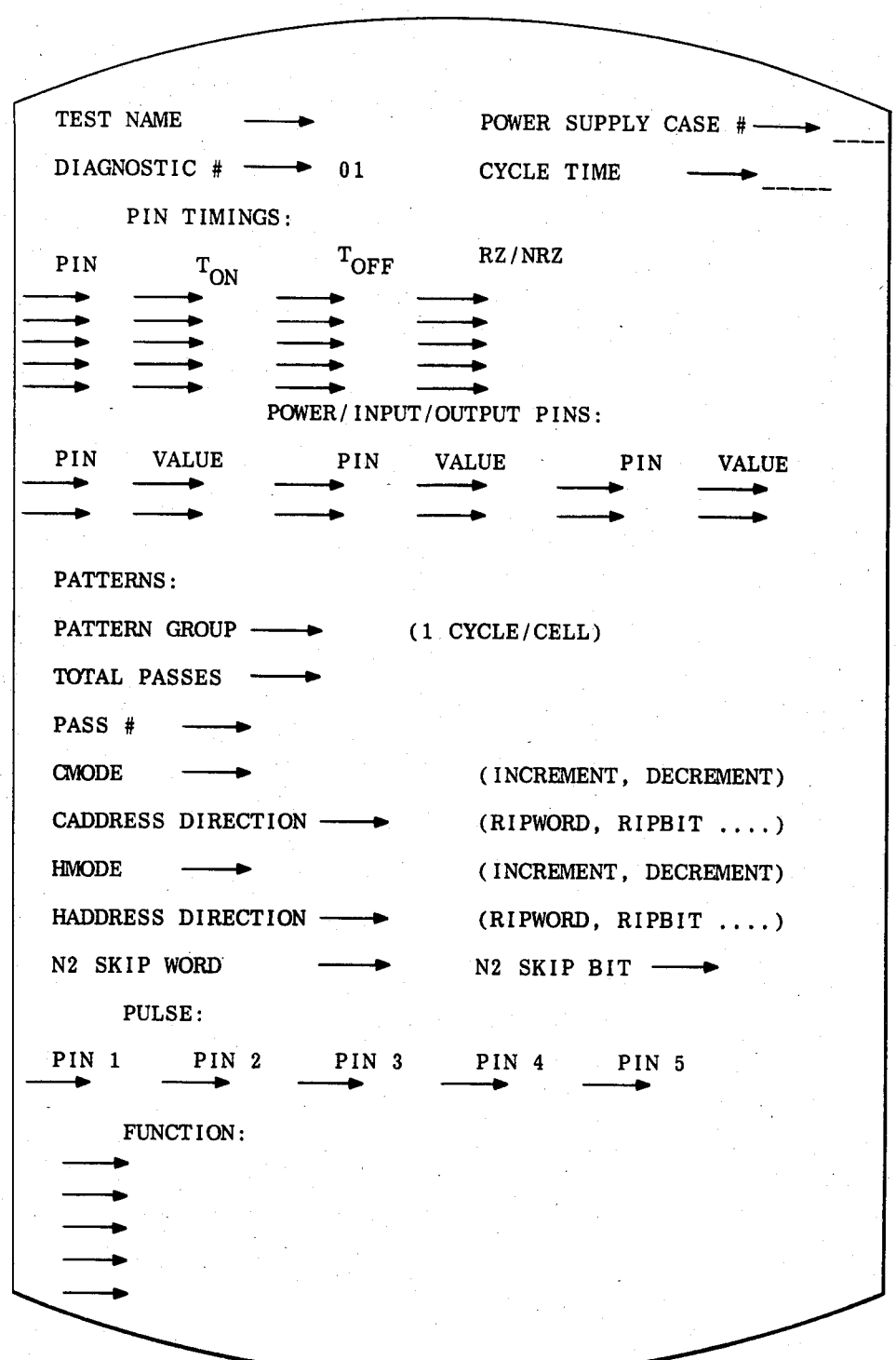
Figure 3J:
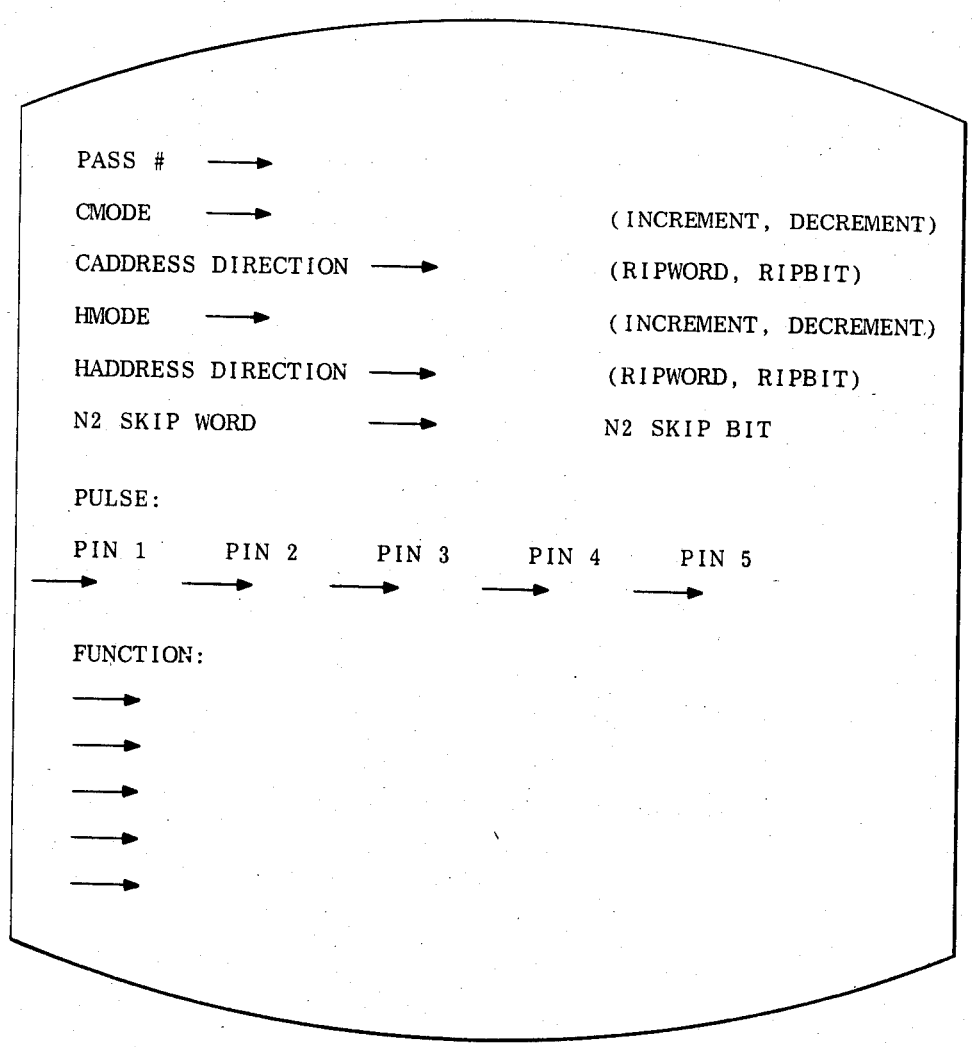
Figure 4:
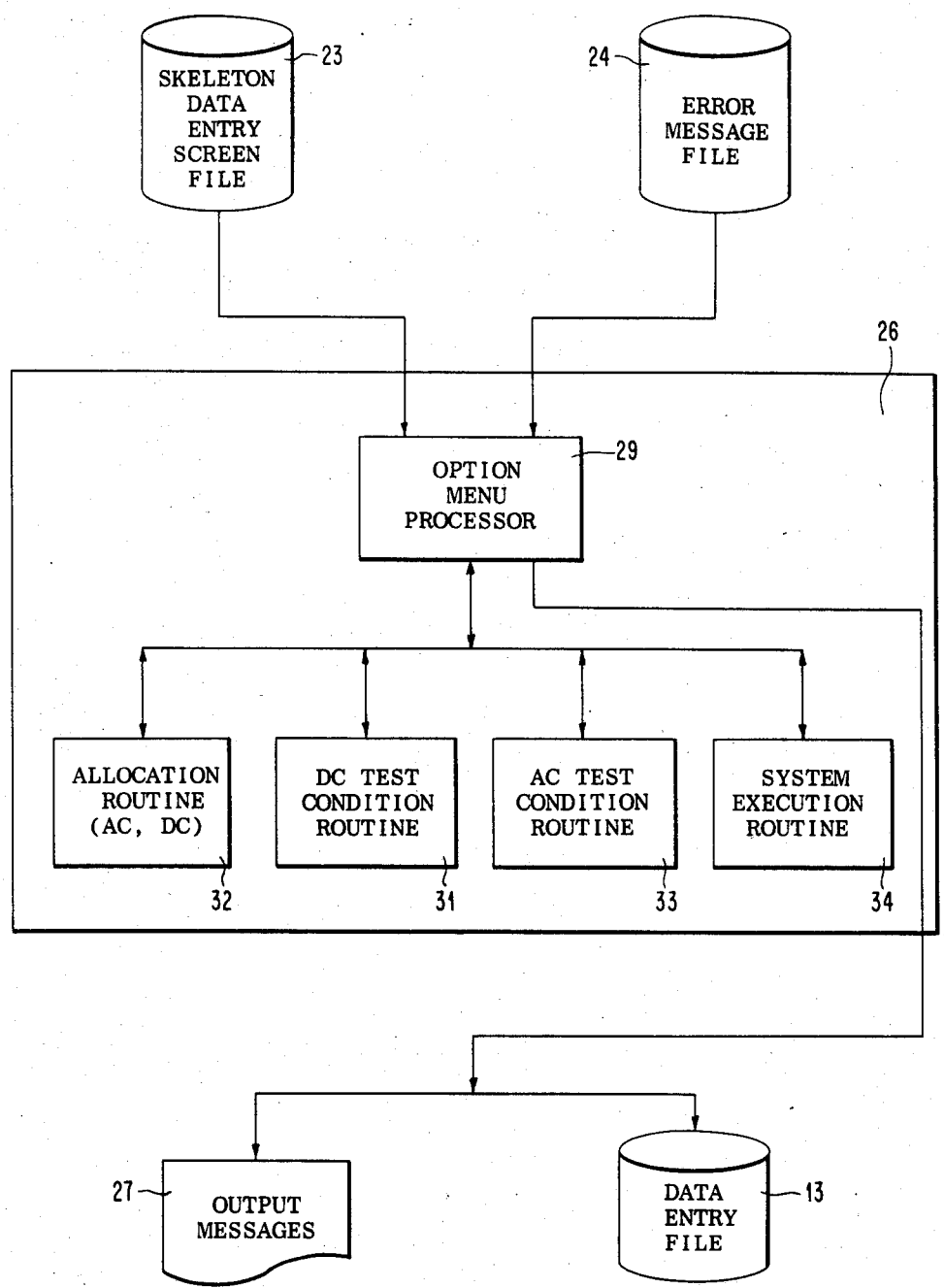
FIG. 4 illustrates the screen image manager and auditor employed in FIG. 2.

Referring now to FIG. 4, there is illustrated the detailed architecture of screen image manager and auditor 26. Option menu processor 29 is the main controlling software. Option menu processor 29 deciphers the user responses to the presented screens (to be described in connections with FIGS. 3A-3L) and determines which screens to display on interactive data entry device 12. Option menu processor 29 also determines which programs to call to process the interactively entered data. Finally, option menu processor 29 monitors activity within the other programs via return codes and provides a linkage with the skeleton data entry screen file 23 and error message file 24.

Allocation routine 32 processes the user's response to the AC and DC Allocation Screens (to be described below in connection with FIGS. 3B and 3C). The data entered in connection therewith is used to construct unique data sets in data entry file 13 for supporting subsequent processing.

DC test condition routine 31 processes the user data entered in connection with the Power Supply Screen, DC Test Limits Screen and DC Test Site Limit Screen (to be described more particularly in connection with FIGS. 3E, 3F and 3G, respectively). Each of the fields completed by the user is checked for proper syntax, completeness, and where possible for technical accuracy as will be described below.

AC test condition routine 33 processes the user information entered in connection with the Power Supply Screen and AC Array Test Limit Screen and Additional Pass Screen (to be described below in connection with FIGS. 3E, 3I, and 3J respectively). Each of the fields completed by the user is checked for proper syntax, completeness and where possible for technical accuracy as will be described below.

System execution routine 34 interprets user responses on the Background Processing Menu (to be described in connection with FIG. 3L). System execution routine 34 sets up the required job control language for executing the requested user option as will be described below.

Referring now to FIG. 3, the interactive data entry screens presented on interactive data entry device 12 by data entry manager 11 will now be described. In connection with this description, the sequence of displaying the screens will be described along with the format and data entered therein. For ease of description, the entry of specific test data will be illustrated in connection with FIG. 3.

The data entered by the user is contained in a high level array test specification 20 which uniquely specifies the requisite DC parametric tests, AC parametric tests and AC pattern tests which the array designer wishes to perform for the particular array. The information in high level specification 20 is tester independent, i.e., it specifies the requisite tests to be performed on the array without regard to the particular tester which will be employed.

When the system of the present invention is initialized, the Primary Option Menu Screen illustrated in FIG. 3A appears on the data entry device 12. This screen requires the user to select one of six options. Option 1 will cause the DC Array Library Allocation Screen of FIG. 3B to appear. Option 2 will cause the AC Array Library Allocation Screen of FIG. 3C to appear. Option 3 will cause the DC Test Screens illustrated in FIGS. 3D-3G to appear in a sequence which will be described more particularly below. Option 4 will cause AC Test Screens illustrated in FIGS. 3H-3J to appear in a sequence described below. Option 5 will cause the Foreground Processing Screen of FIG. 3K to appear while Option 6 will cause the Background Processing Screen of FIG. 3L to appear.

It will be noted that Options 1 and 2 must be selected prior to selecting Options 3 and 4, respectively. If this is not done, an appropriate error message will be displayed.

The interactive data entry screens of FIGS. 3B-3C will now be described in detail. In order to more easily describe interactive entry of an array test specification, representative examples for both DC and AC tests will be illustrated from the user's view.

DC PRODUCT TEST EXAMPLE: For DC tests, both a DC product test (performed on an integrated circuit array of interconnected memory cells) and a DC test site test (performed on an integrated circuit chip having unconnected device thereon) will be illustrated. The examples of the DC product test, DC test site test and AC test which are initially presented here, will be carried through the remainder of this specification in order to illustrate how representative test data is processed through the entire test system of FIG. 1. For purposes of illustrating DC product test data entry, assume that high level test specification 20 calls for an input current measurement on array pin P1, with the $V_{CC}$ power supply being set to 2 v and the $V_{BB}$ supply being set to 0 v. The test also requires a 200 mV voltage to be applied to pin P1 while an 800 mV voltage is applied to pins P2 and P3. The measured input current should be between 100 and 500 $\mu$A.

The above DC test data is entered as follows: When the Primary Option Menu screen of FIG. 3A appears, the user selects Option 1. This causes the DC Array Library Allocation screen of FIG. 3B to appear. The Allocation Screen of FIG. 3B requires the user to enter a series of general product description parameters which will subsequently be used by the test system to uniquely allocate all the required data sets for subsequent processing of DC test data. More particularly, referring to FIG. 3B, the "TECHNOLOGY" field identifies which array product family that is being tested. The "PRODUCT TYPE" field identifies the package level. The "PART # ID" and "ENGINEERING CHANGE LEVEL" fields identify the specific array component within the array product family and its current design level. Finally, the "DISPOSITION" field identifies whether this session is generating a totally new set of DC test data or modifying existing data.

Upon completion of data entry in the Allocation Screen of FIG. 3B, screen image manager 26 will again present the Primary Option Menu of FIG. 3A. Then, in order to enter the DC Product test data of the above example, the user selects "DC TEST DATA ENTRY" (Option 3). Selection of Option 3 causes DC Test Data Entry Screen of FIG. 3D to appear. The DC Test Data Entry Screen allows the user to select the desired type of DC testing information to be entered. The user enters a "PROJECT IDENTIFICATION" along with a "TEST PROGRAM" name whose format definition is described on the screen. The "MEMBER" field identifies which type of DC test data is to be accessed and updated. The format of the member field is the following:

"D"
xxx—technology
y—First letter of product type
z—Suffix level
"L" or "S"—"L"→test limits, S→supply.

After completing the DC test data entry screen of FIG. 3D, if selected, a selection list is provided to the user containing the available members according to the above described format for "MEMBER" field. In order to input the test data example described above, the user would select the power supply limits, and the Supply Menu Screen of FIG. 3E would appear.

Referring to FIG. 3E, the "POWER SUPPLY CASE NUMBER" field identifies each unique power supply configuration desired for testing. This allows the flexibility of different power supply configurations within the same DC array tests. The "POWER SUPPLY CASE NUMBER" field provides a link between the information in the Supply Menu Screen of FIG. 3E and the Test Limit Screen of 3F as will be described below. This field is set to "1". The "TOTAL NUMBER OF CASES" field is merely the total number of unique power supply configurations which are defined by high level test specification 20. In this example, this field is set to "1". In order to enter the data of the above example, the user fills in the "$V_{CC}$" fields for groups 1 and 2 with the keyword "$V_{CC}$" and the "$V_{BB}$" fields for groups 1 and 2 with keyword "$V_{BB}$". By representing the power supplies as two groups of power pins there is the flexibility of sharing physical power supply pins if product demands additional power pins for a given supply voltage. This will be used in conjunction with the "MODE" field described below.

The "POWER SUPPLY CLAMP" voltage and compliance current "RANGE" values are preinitialized to standard values as shown in FIG. 3E. The user has the option of using the pre-initialized values or changing them. The "MODE" field can be one of three values for any one of the five power supplies $V_{CC}$, $V_{BB}$, $V_{EE}$, $V_{11}$, $V_{22}$.

The "STANDARD" mode is used when the number of power supply pins required for a given supply voltage for a given array product conform to the total number of supply pins available in groups 1 and 2. The "MULTIPLE" mode and "DUAL" mode are used when more than the total number of supply pins are needed than available in groups 1 and 2. "MULTIPLE" is used when a group 1 and/or group 2 is needed to be shared by only one supply setting. If group 1 and group 2 are needed to be shared by two different supply settings then "DUAL" will be used. The pre-initialized value is "STANDARD". The "IOCLAMP" and "IORANGE" fields are pre-initialized to the values as shown in FIG. 3E. The user has the option of using the pre-initialized values or changing them.

Upon completing the Supply Menu Screen (FIG. 3E), the user again will be presented with the Data Entry Selection List as previously described. The user then selects the DC Test Limits Screen and the screen shown in FIG. 3F will appear. In order to suply the data for FIG. 3F the user first supplies an 8 character "TEST NAME" which will be used to identify the test being specified. The "DIAGNOSTIC NUMBER" is pre-initialized to 1. The "DIAGNOSTIC NUMBER" will be used for failure correlation and the user can modify this number. The "DELAY" field allows the user flexibility to override the system calculated delay. Otherwise, the system calculates a settling time delay for delaying the measurement time until the power supplies settle down. In order to enter the data of the above described DC product test example, "P1", "500 $\mu$A" and "100 $\mu$A" are entered into the "MEASURED PIN", "HIGH LIMIT", and "LOW LIMIT" fields, respectively. The "POWER SUPPLY CASE NUMBER" field is set to "1" indicating which of the configurations in the power supply screen of FIG. 3E is to be used for this test. The "PIN" and "VALUE" fields of FIG. 3F contain any applied conditions required. In the particular example above, the following pins and values would be entered:

| "PIN" | "VALUE" |
|---|---|
| P1 | 200 mV |
| P2 | 800 mV |
| P3 | 800 mV |
| VCC | 2 V |
| VBB | 0 V |

The fields on the bottom third of FIG. 3F relate to the requirement of writing a pulse during the performance of a DC test. If high level test specification 20 calls for pulse writing, then the pulse is specified by filling in the bottom third of FIG. 3F. The "TYPE" field determines whether AC or DC switches are to be used. The "PIN" field is the pin number to be pulsed. The "LEAD" and "TRAIL" field define the leading and trailing edges of the pulse, entered as time value and units (e.g., 20 ns for twenty nanoseconds). The return to zero field determines if it is a transition or complete pulse.

After DC Test Limit Screen of FIG. 3F is completed, the screen entry for a single DC product test is complete and the Primary Option Menu of FIG. 3A would again be displayed. Of course, a number of DC products test cases may be entered in the manner specified above.

In order to complete the description of interactive entry of DC test data, a second example will be illustrate entry of DC test site data.

DC TEST SITE TEST EXAMPLE: Assume that high level test specification 20 calls for a $V_{BE}$ transistor measurement of between −500 mv and −700 mv. In order to enter this data, the above described interactive data entry process would be followed except that the user would be presented with the DC Test Site Limit Menu of FIG. 3G, instead of the DC Test Limits Menu of FIG. 3F. Presentation of screen 3G as opposed to 3F would be determined by the data entered into the "PRODUCT TYPE" field of the DC Array Library Allocation Screen of FIG. 3B.

Upon presentation of the DC Test Site Limits Menu of FIG. 3G, the user would enter a test name to identify the test being specified. The "PIN (POS)" and "PIN (NEG)" fields are employed to select what points on the transistor are to be measured between. In the above example, only the positive pin needs to be specified and the user would input product pin corresponding to the emitter pin number. For illustration this is product pin P1. The value −500 mV and −700 mV are entered into the "MAX LIMIT" and "MIN LIMIT" fields, respectively.

The "DIAGNOSTIC NUMBER" field is pre-initialized to "01". This field is used for failure correlation and can be modified by the user. The "POWER SUPPLY CASE NUMBER" field is set to "1", thus indicating which of the configurations in the Supply Menu (FIG. 3E) is to be used. The "EMITTER PIN" and "EMITTER VALUE" fields are set to the emitter pin name (P1) and the applied current value ($-10\ \mu A$) as specified in high level test spec 20. The "BASE PIN" (P2) is set to ground ("GND"). Likewise, the "COLLECTOR PIN" (P3) is set to ("GND"). Other conditions or process parameters may also be specified if required by high level test specification 20. Upon completion of the DC test site tests, the user would return to the Primary Option Menu of FIG. 3A.

In order to complete the description of data entry screens of FIGS. 3A-3L, an AC test example will be illustrated.

AC TEST EXAMPLE: The particular example illustrated will be a well known checkerboard test, incrementing in the word direction. The test is to be performed with a 100 ns cycle time. The read and write pulses are 20 ns and power supply Vcc is 0 v, power supply Vbb is $-2$ v and supply $V_{EE}$ is $-5$ v.

As with the DC tests described above, the user begins with the Primary Option Menu Screen of FIG. 3A and selects option 2. The AC Array Library Allocations Screen of FIG. 3C will appear. The Allocation Screen of FIG. 3C requires the user to enter a series of general production description parameters which will subsequently be used by the test system to uniquely allocate all the required data sets for subsequent processing of AC test data. More particularly, referring to FIG. 3C, the "TECHNOLOGY" field identifies which array product family is being tested. The "PRODUCT TYPE" field depicts the package level. The "PART NUMBER" and "ENGINEERING CHANGE LEVEL" fields identify the specific array components within the general array product family and its current design level. The "NUMBER OF WORD ADDRESSES" and the "NUMBER OF BIT ADDRESSES" define the address dimension of the array. The "NUMBER OF DATA LINES" define the data-in and data-out ports of the array. The "NUMBER OF CONTROL LINES" define the number of control gates associated with the write, read or data line. The "DESIGN" field refers to the physical layout of the array, i.e., interwoven or non-interwoven. Finally, the "DISPOSITION" field identifies whether the session is generating a totally new set of AC test data or merely modifying existing data.

Upon completion of data entry in the AC Array Library Allocations Screen of FIG. 3C, screen image manager 26 will again present the Primary Option Menu of FIG. 3A. Then, in order to enter the AC test data of the above example, the user selects "AC TEST DATA ENTRY" (Option 4). Selection of Option 4 causes the AC Test Data Entry Screen of FIG. 3H to appear. This screen allows the user to select the desired type of AC testing information to be entered. The information specified here has already been described above in connection with FIG. 3D.

After completing the AC Test Data Entry Screen of FIG. 3H, if selected, a selection list is provided to the user (as was described above) which allows a choice of either power supply limit or input/output test limits. In order to input the test data described above, the user would select the power supply limits, and the Supply Menu Screen of FIG. 3E would appear. This menu was already described in detail above with regard to the DC test example and will not be described again.

Upon completing the Supply Menu Screen of FIG. 3E, the user again will be presented with the Data Entry Selection List. The user now selects the AC Test Limit Menu and the screen shown in FIG. 3I will appear. In order to supply the data for FIG. 3I, the user first supplies an 8 character test name which will be used to identify the test being specified. The "DIAGNOSTIC #" field is pre-initialized to "01". The "DIAGNOSTIC#" will be used for failure correlation and the user can modify this number. The "POWER SUPPLY CASE #" field is set to "1", indicating which of the configurations of the power supply screen is to be used for this test. The "CYCLE TIME" field is the cycle time for the test, and according to the above example 100 ns would be placed therein. The "PIN TIMINGS" field contains pulse information needed to perform the requisite AC test. Continuing with the AC test example, product read pin would have a $T_{ON}$ of 0 ns, $T_{OFF}$ of 20 ns and would be a return to zero pulse ($R_Z$). For illustrative purposes assume product read pin is R1. The write pin (assumed to be called W1) would be defined in an identical manner.

The "POWER/INPUT/OUTPUT PIN" field would then be filled in as follows: "PIN": Vcc, "VALUE": 0 V, "PIN": $V_{BB}$, "VALUE": $-2$ V, "PIN": $V_{EE}$, "VALUE": $-5$ V. The "PATTERN GROUP" field would be set to "1 CYCLE/CELL" for the AC Test example. Other acceptable pattern group fields are $N^2$, 4 cycle/cell, etc, corresponding to well known test patterns. The "TOTAL PASSES" field would be set to 2. This field is used by the test system to determine the number of additional pass screens (to be described with regard to FIG. 3J). A pass is defined as the number of operations to be performed during a test cycle. The pass number field is a digit identifying this operation cycle. The "CMODE" field describes whether the current addressing is to be in an incremental or decremental fashion. In the present example, it would be incremental.

Continuing with the description of FIG. 3I, the "CADDRESS DIRECTION" field indicates the addressing scheme for processing through the array. In the above AC Test Example it is rippling through the word address (ripword). The "HMODE" and "HADDRESS DIRECTION" have the same meaning as previously described only refer to $N^2$ home array addresses. The "$N^2$ skip word" and "$N^2$ SKIP BIT" field are used if a reduced $N^2$ or ping-pong test is desired. If a reduced rather than a complete $N^2$ is to be done, these fields will define the reduced addressing scheme by indicating the number of words or bits to be skipped when jumping through the away addresses.

The pulse section (lower third of FIG. 3I) identifies which pins are to be pulsed during the pass. In the AC Test Example specified above, the first pass is a write cycle, so the write pin (W1) would be pulsed. Finally, the function section at the bottom of FIG. 3I specifies the array operation to be performed. Since the AC Test Example is a single cycle per cell test, a single array operation is performed in the first pass. Thus, for the AC example described above, "WX0" would be specified. The permissible functions are contained in Table 2. Thus, the user could enter multiple functions from Table 2 indicating distinct operations per cell for this pass through the array. Each of these functions are well known in the testing art and will not be elaborated in detail.

TABLE 2

| AC PATTERN FUNCTIONS: | |
| --- | --- |
| (1) READ UNIFORM ZERO: | RU0 |
| (2) READ UNIFORM ONE: | RU1 |
| (3) READ CHECKERBOARD STARTING WITH ZERO: | RX0 |
| (4) READ CHECKERBOARD STARTING WITH ONE: | RX1 |
| (5) READ SINGLE BIT STARTING WITH ZERO: | RS0 |
| (6) READ SINGLE BIT STARTING WITH ONE: | RS1 |
| (7) READ DATA-IN BARS STARTING WITH ZERO: | RD0 |
| (8) READ DATA-IN BARS STARTING WITH ONE: | RD1 |
| (9) READ COLBARS STARTING WITH ZERO: | RC0 |
| (10) READ COLBARS STARTING WITH ONE: | RC1 |
| (11) READ ZERO AT HOME ADDRESS: | RH0 |
| (12) READ ZERO AT AWAY ADDRESSES: | RA0 |
| (13) READ ONE AT HOME ADDRESS: | RH1 |
| (14) READ ONE AT AWAY ADDRESSES: | RA1 |
| (15) WRITE UNIFORM ZERO: | WU0 |
| (16) WRITE UNIFORM ONE: | WU1 |
| (17) WRITE CHECKERBOARD STARTING WITH ZERO: | WX0 |
| (18) WRITE CHECKERBOARD STARTING WITH ONE: | WX1 |
| (19) WRITE SINGLE BIT STARTING WITH ZERO: | WS0 |
| (20) WRITE SINGLE BIT STARTING WITH ONE: | WS1 |
| (21) WRITE DATA-IN BARS STARTING WITH ZERO: | WD0 |
| (22) WRITE DATA-IN BARS STARTING WITH ONE: | WD1 |
| (23) WRITE COLBARS STARTING WITH ZERO: | WC0 |
| (24) WRITE COLBARS STARTING WITH ONE: | WC1 |
| (25) WRITE ZERO AT HOME ADDRESS: | WH0 |
| (26) WRITE ZERO AT AWAY ADDRESSES: | WA0 |
| (27) WRITE ONE AT HOME ADDRESS: | WH1 |
| (28) WRITE ONE AT AWAY ADDRESSES: | WA1 |

When the "FUNCTIONS" field of the AC Test Limit Screen of FIG. 3I have been filled in, the first pass of the checkerboard test has been completed. The data entry manager would automatically present an additional pass screen (FIG. 3J). The total number of pass screens presented is a function of the "TOTAL PASS #" field of FIG. 3I. The fields in the additional pass screen of FIG. 3J have already been described in connection with AC Test Limit Screen of FIG. 3I and will not be redescribed. The user would complete the additional pass screen of FIG. 3J for the "RX0" function. Upon completion, the Primary Option Menu of FIG. 3A will again appear. Since Options 1-4 have already been completed, the user would select Option 5 to perform foreground processing. The Foreground Processing Screen of FIG. 3K would then appear. The Foreground Processing Screen of FIG. 3K directs the system to execute the auditor portion of the screen image manager and auditor program 26 and perform the data integrity audits. These audits have been described previously and will not be redescribed here. Likewise, all of the fields in the Foreground Processing Screen of FIG. 3K have been described in connection with the AC Test Data Entry Screen of FIG. 3H and will not be described again. Upon completion of foreground processing, the Primary Option Menu of FIG. 3A will again appear.

Following a successful on-line audit, Option 6 may be employed for background processing. Upon selection of Option 6, the Background Option Menu of FIG. 3L will appear. The Background Processing Menu allows the user to direct the system to generate the universal language instruction sequence 16 of FIG. 1. The options fields merely require a yes/no response with the exception of "TESTER". The generation of universal language source instruction sequence 16 will be described in detail below.

UNIVERSAL LANGUAGE GENERATOR

Figure 5:
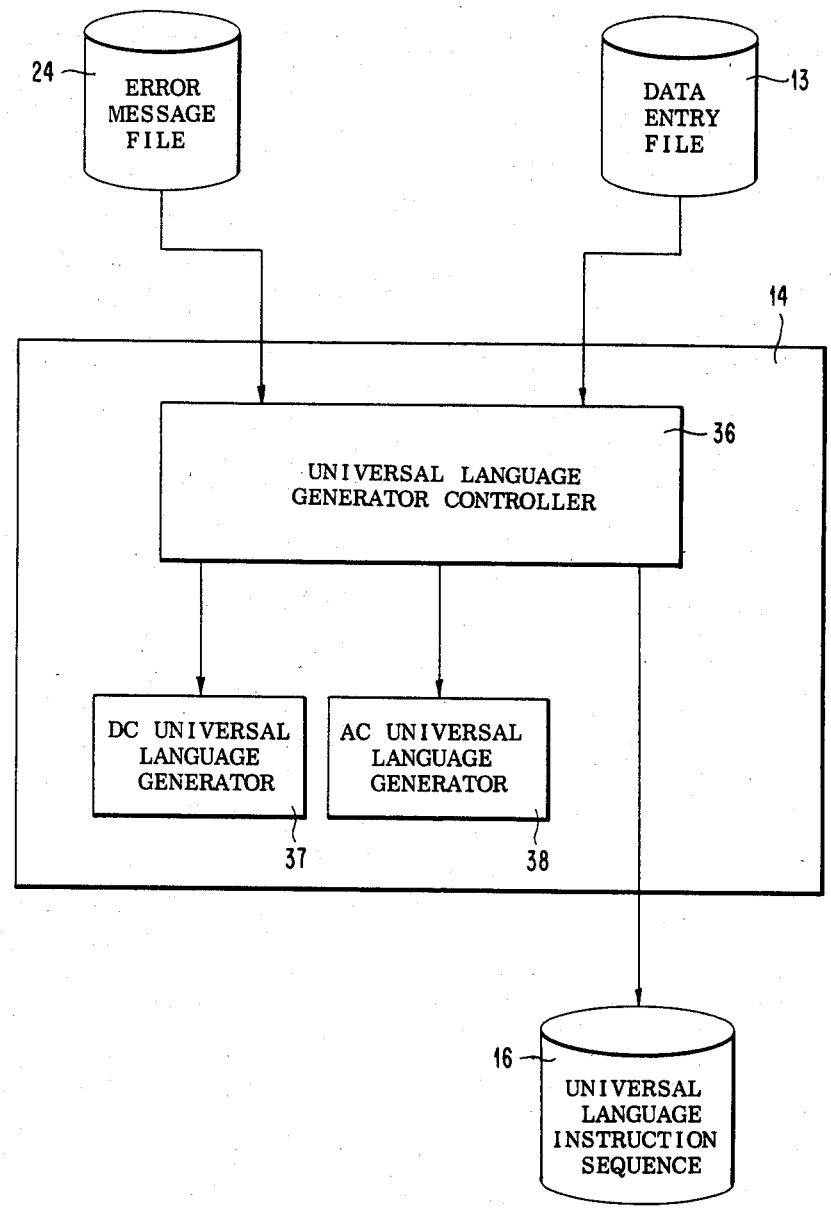
FIG. 5 illustrates the universal language generator employed in FIG. 1.

Referring now to FIG. 5, the universal language generator will be described in detail. As shown in FIG. 5, universal language generator 14 comprises three major modules; i.e., universal language generator controller 36, DC universal language generator 37, and AC universal language generator 38. Each major module will be described in more detail below.

The inputs to universal language generator 14 are the data entry file 13 and the error message file 24 both of which have been described above with regard to interactive data entry.

Universal language generator controller 36 is the main routine controlling overall operation of universal language generator 14. Controller 36 manages input/output data base operations, program entry/exit linkages, and system core allocations for internal processing by DC and AC language generators 37 and 38 respectively. Controller 36 also monitors (via return codes) the success or failure of language generators 37 and 38. If encountering a failure it will select the appropriate message member from the partitioned error message file 24. The appropriate error message file member names along with a corresponding return code are contained in an internal table in the controller. By matching the return codes from generators 37 and 38 with those of the table, the controller selects the corresponding error message member name. Controller 36 uses parameters triggered by the background processing options (FIG. 3L) to determine which language generator to call.

Referring again to FIG. 5, the DC universal language generator 37 is a module which generates DC universal language statements. The organization and internal components of DC universal language generator 37 are illustrated in FIG. 6.

Figure 6:
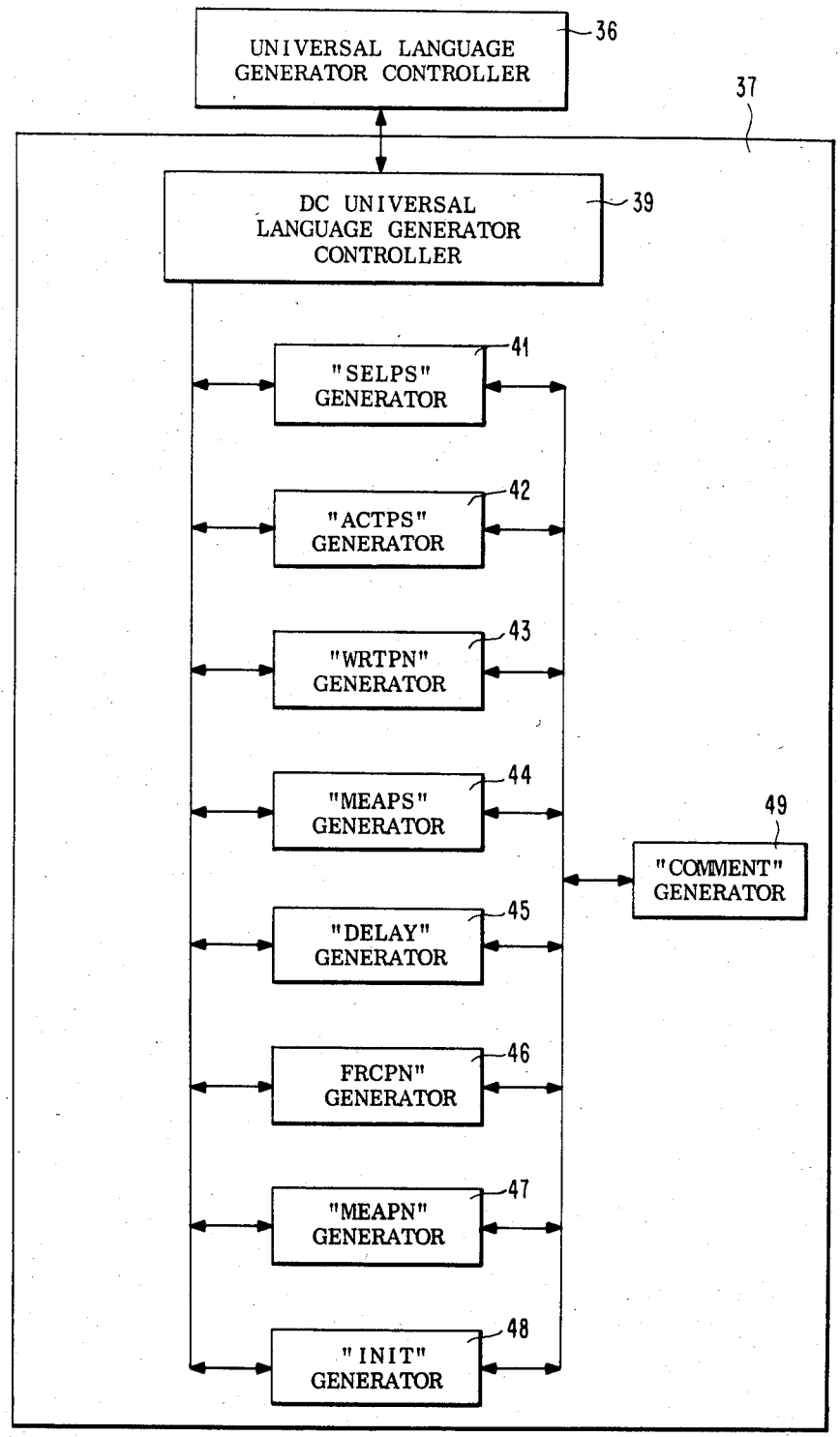
FIG. 6 illustrates the DC universal language generator employed in FIG. 5.

Referring now to FIG. 6, the main routine in DC universal language generator 37 is the DC universal language generator controller 39. Controller 39 has the overall managing function for DC Product and DC Test Site universal language source generation. Controller 39 determines the major type of test requested (i.e., product or test site tests) from the DC array allocation screen of FIG. 3B. Based upon the type of test and the contents of data entry file 13, controller 39 determines which language source generator routines (41-49) to call and what order they are to be called in. Controller 39 also has responsibility for managing the entry/exit linkages among all the routines and monitoring, via return codes, the activities in each of the language source generators 41-49. Controller 39 also communicates appropriate errors and the generated universal language source statements to the main universal language generator controller 36.

Controller 39 first processes the supply menu of FIG. 3E and creates an internal power supply table which all generator routines 41-49 can access. The table is indexable by power supply case #. Each supply has 8 data fields associated with it. They are "ID", "VOLTAGE", "VALUE", "COMPLIANCE CURRENT", "MODE", "CLAMPING VOLTAGE", "SELECT INDICATOR" (Yes, No), and "ACTIVATE" (Yes, No). All of these fields except voltage value are directly discernible from the supply menu of FIG. 3E. "VALUE" is derived from the test limits data and will be described in that section. In addition, the "IO CLAMP" and "IO RANGE" will be saved in commonly accessible storage areas for insertion in the FRCPN statement when FRCPN generator 46 is called.

Controller 39 will then operate on the DC product test limits data of FIG. 3F or the DC test site limits data of FIG. 3G as stored in the data entry file 13, and create internal tables and commonly accessible storage areas which contain this information and can be accessed by any of the universal language generator routines 41-49. The "TEST NAME", "DIAGNOSTIC #", MEASURED PIN", "HIGH AND LOW LIMITS" and "POWER SUPPLY CASE NUMBER" from either limits screen is saved in a common storage area. Controller 39 will construct an internal input/output state table and a write table array from the remaining screen information. The internal inut/output state table will be organized with two entries per pin for all non power supply pins. The entries are "PIN NAME" and "VALUE". The pins which have power supply ID names will have their values compared against values already in the internal power supply table for the power supply case number requested. This will be done by matching the supply and if the values are different, the supply will have the new value inserted and the select set to yes. All supplies appearing in the screens regardless of value will have the activate indicator set.

The write table array will be built from the write information in the limits screen. There will be five entries per pin. The entires are "PIN NAME", "LEADING EDGE OF TRANSITION", "TRAILING EDGE OF TRANSITION", "DC/AC OR NONE", and "RETURN OR NON-RETURN TO ZERO". In addition a write flag will be set in an internal common area.

After the above described processing is completed, controller 39 calls INIT generator 48 to generate TSTID, COMMENT, and DMODE statements. Upon returning from INIT, controller 39 calls SELPS generator 41. This generator determines which if any SELPS statements need to be issued. Upon return from SELPS generator 41, ACTPS generator 42 is called. Following ACTPS, controller 39 calls FRCPN generator 46. Next controller 39 examines the write flag to determine if a write is required. If so it will call WRTPN generator 43. Next DELAY generator 45 will be called. Finally, controller 39 examines the pin to be measured. If it is a power supply, it will call MEAPS generator 44, otherwise it will call MEAPN generator 47.

Referring again to FIG. 6, the generator routines 41-49 will now be individually described. The DC universal language instruction set is described in Table 3. Table 3 includes a description of each DC universal language instruction, the purpose thereof, field definitions and a typical example. Each universal language instruction is referenced to the associated generator routine of FIG. 6. Immediately following Table 3, a detailed description of each universal language instruction and the source of the field data contained therein will be presented.

TABLE 3

DC UNIVERSAL LANGUAGE INSTRUCTION SET

| GENERATOR ROUTINE | INSTRUCTION SYMBOL AND PURPOSE | FIELD DEFINITIONS AND EXAMPLE |
|---|---|---|
| 41 | SELPS, P1, P2, P3, P4, P5<br>Purpose: Define a power supply | P1 - power supply ID<br>P2 - voltage and units<br>P3 - compliance current and units<br>P4 - mode of operation: i.e., standard/multiple/dual<br>P5 - clamping voltage<br>Example:<br>SELPS $V_{BB}$ 0 V 1A STANDARD 5 V |
| 42 | ACTPS, P1<br>Purpose: Activate a previously selected power supply | P1 = power supply ID<br>Example:<br>ACTPS $V_{BB}$ |
| 44 | MEAPS, P1, P2, P3, P4, P5, P6<br>Purpose: Measure a power supply | P1 - power supply ID<br>P2 - mode of operation: i.e., standard/multiple/dual<br>P3 - flag:<br>Flag Value H - high limit only measurement<br>Flag Value L - low limit only measurement<br>Flag Value B - both high and low measurement<br>P4 - high measurement value and units<br>P5 - low measurement value and units<br>P6 - diagnostic # used to assign error<br>Example:<br>MEAPS STANDARD B 500 μA 180 μA 20 |
| 46 | FRCPN, P1, P2, P3, P4<br>Purpose: Apply specified force conditions to an I/O pin | P1 - value and units<br>P2 - range and units<br>P3 - clamping condition and units<br>P4 - pin or pins to be forced<br>Example:<br>FRCPN 700 mV 10 mA 2.5 V A02 |
| 47 | MEAPN, P1, P2, P3, P4, P5<br>Purpose: Measure an I/O pin | P1 - Flag:<br>Flag Value H - High limit only measurement<br>Flag Value L - low limit only measurement<br>Flag Value B - both high and low measurement<br>P2 - high measurement value and pin<br>P3 - low measurement value and pin<br>P4 - diagnostic # used to assign error conditions |

TABLE 3-continued
DC UNIVERSAL LANGUAGE INSTRUCTION SET

| GENERATOR ROUTINE | INSTRUCTION SYMBOL AND PURPOSE | FIELD DEFINITIONS AND EXAMPLE |
|---|---|---|
| | | P5 - pin or pins to be measured<br>Example:<br>MEAPN B 500 μA 200 μA 25 A01 |
| 43 | WRTPN, P1, P2, P3, P4<br>Purpose: Cause write clock pin to apply a transition | P1 - write clock pin<br>P2 - Flag<br>Flag Value 1 - DC, return to zero, negative polarity<br>Flag Value 2 - DC, return to zero, positive polarity<br>Flag Value 3 - DC, non-return to zero, negative polarity<br>Flag Value 4 - DC, non-return to zero, positive polarity<br>Flag Value 5 - AC, return to zero, negative polarity<br>Flag Value 6 - AC, return to zero, positive polarity<br>Flag Value 7 - AC, non-return to zero, negative polarity<br>Flag Value 8 - AC, non-return to zero, positive polarity<br>P3 - leading edge value and units<br>P4 - trailing edge value and units<br>Example:<br>WRTPN A01 7 −600 mV −1200 mV |
| 45 | DELAY, P1<br>Purpose: Delay between test instruction execution | P1 - amount of delay and units<br>Example:<br>DELAY 8 mS |
| 48 | TSTID, P1<br>Purpose: Identify type of test statements | P1 - AC/DC<br>Example:<br>TSTID DC |
| 49 | COMMENT, P1<br>Purpose: Informational command | P1 - comment<br>Example:<br>COMMENT TEST ABC |
| 48 | DMODE, P1<br>Purpose: Identify diagnostic mode | P1 - on/off<br>Example:<br>DMODE OFF |

Referring now to FIG. 6, and Table 3, SELPS generator routine 41 builds all SELPS universal language statements. This statement defines a power supply. The routine accesses the power supply case number and uses it to index into the previously described internal power supply table. The select indicator for all supplies in this case will be examined to determine if a supply needs to be selected. If selection is needed, the routine uses information previously saved in the internal power supply table to construct a SELPS statement.

ACTPS generator routine 42 builds the ACTPS universal language statement. This statement is used to activate a previously selected power supply. The power supply ID field is derived from the internal supply table and the entries of the table with activate=yes have an ACTPS generated from them.

WRTPN generator 43 builds the WRTPN universal language statement. This statement causes a write clock pin to apply a transition. Generator 43 processes the write information which originated in the write section of the DC test limit records (FIG. 3F) and is saved in the internal write table. The specified information includes the write clock pin, the leading and trailing transition edges, and whether it is a transitory pulse. The routine will determine the polarity (negative or positive) of the transition or pulse by comparing the edges. It processes through the internal write table entries previously described and based on the combination of information in these entries sets a flag in the WRTPN statement. The various combinations are described in Table 3 under the WRTPN statement.

MEAPS generator routine 44 builds the MEAPS universal language statement. This statement measures a power supply. The routine obtains the power supply to be measured, the high and low values and the diagnostic number from data originating in the test limits records of FIG. 3F or 3G. The mode is derived from an internal supply table. For the power supply case being used, the power supply being measured is matched against the supplies in the table and the appropriate mode selected. Values are determined based on whether both high and low limits is specified in the test limits screen or only one or the other.

DELAY generator routine 45 builds a DELAY universal language statement. This statement is used to identify the delay between execution of test instructions. Routine 45 calculates the required delay based on the types of instructions to be used and the number of instructions. Each type of instruction contributes a specific amount of delay. The DC universal language generator controller 39 will indicate by means of a parameter whether an override delay is to be used instead of the calculated delay. The amount of override delay originates from the test limit record of FIG. 3F.

FRCPN generator routine 46 builds the FRCPN universal language statement. This statement is used to apply forcing conditions to input/output pins. The routine constructs and maintains an internal history state table containing the input/output pins and the values to be applied. Routine 46 analyzes the I/O state table constructed by controller 39 and compares the value of each pin in the I/O state table against its corresponding entry in the internal history state array table. Pins with the same values are removed from the I/O state table.

Non matching new pins are added to the history table. After completing a pass through the I/O state table the pins that remain are grouped according to common value to be forced. All unique values will have a FRCPN statement issued. The range and clamping conditions are derived from data originating in the supply record of FIG. 3E.

MEAPN generator routine 47 builds the MEAPN universal language statement. This statement is used to measure an output pin. The routine processes the measurement information which originated in the limits records of FIGS. 3F and 3G. The specified information includes the measured pin, the high and low limits, and the diagnostic number.

The INIT generator routine 48 builds the TSTID and DMODE universal language statements. Between construction of these statements "COMMENT" is called and the test name address passed to it. The TSTID instruction identifies the type of tests being done and the DMODE instruction identifies whether diagnostic mode stop on first fail is requested or whether the tester is to continue even if a failure occurs. The routine saves the DC identifier in the TSTID statement. The diagnostic number saved in a common area by controller 39 is used to determine the diagnostic mode and either an on or off condition will be saved. If the diagnostic number is 0, then "OFF" will be set; otherwise, it will be "ON".

The COMMENT generator routine 49 builds the COMMENT universal language statement. This statement is used to communicate a comment. The routine uses an address parameter passed to it pointing to the comment to be used. COMMENT routine can be called by any other routine. For example, it may be called by INIT routine 48 to generate a test name comment statement.

Figure 7:
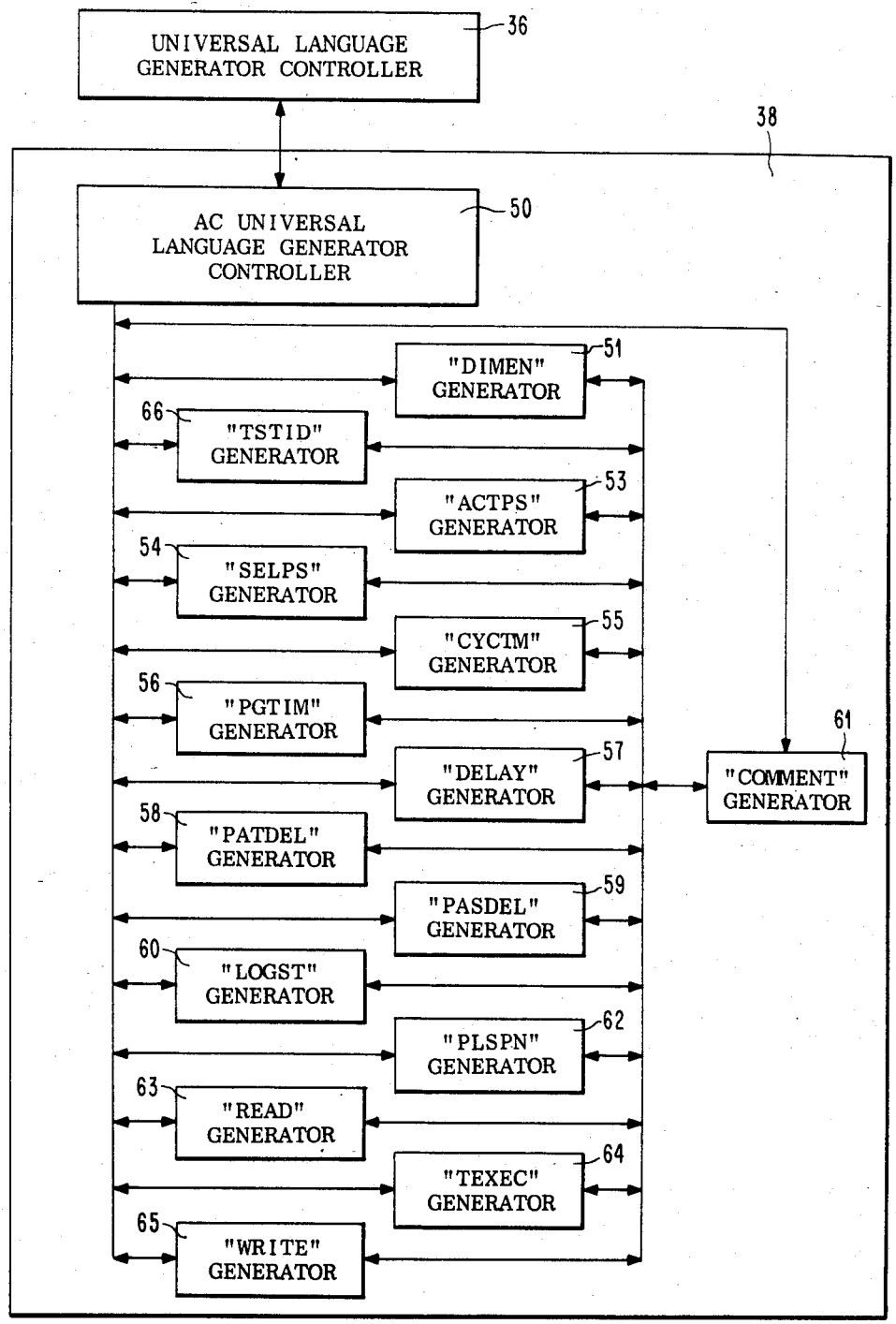
FIG. 7 illustrates the AC universal language generator employed in FIG. 5.

Referring again to FIG. 5, the AC universal language generator 38 is a module which generates AC universal language statements. The organization and internal components of AC universal language generator 38 is illustrated in FIG. 7. Referring now to FIG. 7, the main routine in AC universal language generator 38 is the AC universal language generator controller 50. Controller 50 has the overall managing function for AC product universal language source generation. Based upon the type of test and the contents of data entry file 13, controller 50 determines which language source generator source routines (51-66) to call and in what order they are to be called. Controller 50 also has responsibility for managing the entry/exit linkages among all the routines and monitoring, via return codes, the activities in each of the language source generators 51-66. This monitoring process includes communicating both appropriate errors as well as any universal language source statement built by a source language generator 51-66 to the universal language generator controller 36.

Controller 50 first constructs an internal power supply table from the supply menu of FIG. 3E. This table is accessible by any of generator routines 51-66 and is indexable by power supply case number. Each supply has seven data fields associated with it. They are "ID", "VOLTAGE VALUE", "COMPLIANCE CURRENT", "MODE", "CLAMPING VOLTAGE", "SELECT INDICATOR" (Yes/No), and "ACTIVATE" (Yes/No). All of these fields except "VOLTAGE VALUE" are derived from the test limits data and will be described in that section. Controller 50 then processes the AC limits screen of FIG. 3I. The "TEST-NAME", "DIAGNOSTIC #", "POWER SUPPLY CASE #", and "CYCLE TIME" will be saved in commonly accessible storage areas to be used by any of generator routines 51-66. An internal pin timing table is constructed from the timing information specified in the test menu. There are five table elements per pin. They are "PIN NAME", "TURN-ON TIME", "TURN-OFF TIME", "RETURN OR NON-RETURN TO ZERO" and "SELECT" (Yes/No). All pins in the menu will be matched against the pins and values already in the pin timing table. Pins which match and whose values are the same will have "SELECT" set to "NO" and will not be respecified by PGTIM Generator 56. The dissimilar values will be inserted into the table and "SELECT" set to "YES". Non-matching pins will be added to the internal pin timing table as new and have "SELECT" set to "YES".

The "PIN/VALUE" section of the test menu will then be processed. Controller 50 will construct an internal INPUT/OUTPUT state table array with two entries per pin for all non power supply pins. The entries are "PIN NAME" and "VALUE". Pins which have power supply ID names will have their values compared against values already in the internal power supply table for the power supply case number indicated in the commonly accessible storage area. This is done by matching the supply ID pin names. If the values are different the supply will have the new value inserted and the select set to yes. All supplies appearing will have the activate indicator set.

The pattern section is processed next by controller 50. The "PATTERN GROUP", "TOTAL PASSES", "PASS #", "CMODE", "CADDRESS DIRECTION", "HMODE", "HADDRESS DIRECTION", "$N^2$ SKIP WORD", and "$N^2$ SKIP BIT" fields are all saved in commonly accessible internal storage areas. An internal pulse table is constructed from the pulse section of the menu. This table has one element per pin, i.e., the pin name.

The function section is processed next. The three character function operations illustrated in Table 2 are saved in a function table with each function being an element. Also a count of the number of functions is kept and saved in a commonly accessible storage area to be used by the PASDEL routine 59. TSTID routine 66 is then called and after its completion controller 50 will call the COMMENT routine 61 passing to it the address of the commonly accessible storage area containing the test name. Next DIMEN generator 51 followed by SELPS generator 54 will be called. SELPS generator 54 determines which if any SELPS statements need be issued. ACTPS routine 53 will be called next followed by PGTIM routine 56. These routines will determine which if any ACTPS and PGTIM statements need be issued. CYCTM routine 55 will be called next. Following CYCTM, controller 50 will call TEXEC and DELAY generators 64 and 57, respectively. It will then call COMMENT generator 61 passing it the address of the commonly accessible storage area containing the pattern group. PATDEL routine 58 followed by PASDEL routine 59 will be called next.

Controller 50 will then analyze the function table elements one at a time. It will key off the first character to determine whether to call READ or WRITE routines 63 or 65, respectively. "W" indicates write and "R" indicates read. The correct routine will be passed the address of the function table element. After finishing processing through the function table the PLSPN routine 62 will be called. This completes the processing for the menu of FIG. 3I.

Controller 50 then examines the total passes field specified to see if any FIG. 3J means are required. The controller will process FIG. 3J menus until the total pass field is satisfied. This processing consists of saying the "PASS #", "CMODE", "CADDRESS DIRECTION", "HMODE", "HADDRESS DIRECTION", "N² SKIP WORD" and "N² SKIP BIT" fields in commonly accessible internal storage areas. Internal pulse table and function tables are constructed as previously described. Starting with a call to PASDEL generator 58, the remaining controller processing is the same as previously described for the menu of FIG. 3I. This is the same for all FIG. 3J menus.

Referring again to FIG. 7, generator routines 51–66 will now be individually described. Each generator routine generates a single universal language statement type. The AC universal language statement types are described in Table 4. Table 4 includes a description of each AC universal language statement, the purpose thereof, field definitions and a typical example. Each universal language statement is referenced to the associated generator routine of FIG. 7. Immediately following Table 4, a detailed description of each universal language instruction and the source of the field data contained therein will be presented.

TABLE 4

AC UNIVERSAL LANGUAGE STATEMENTS

| GENERATOR ROUTINE | INSTRUCTION SYMBOL AND PURPOSE | FIELD DEFINITIONS AND EXAMPLE |
|---|---|---|
| 66 | TSTID, P1<br>Purpose: Identify type of test statements | P1 - AC/DC<br>Example:<br>TSTID, AC |
| 51 | DIMEN, P1, P2, P3, P4, P5, P6<br>Purpose: Communicate array dimension and related information | P1 - # of word address lines<br>P2 - # of bit address lines<br>P3 - # of control lines<br>P4 - # of data in lines<br>P5 - # of data out lines<br>P6 - Flag<br>Flag 1 - interwoven<br>Flag 2 - non interwoven<br>Example:<br>DIMEN 7 4 6 10 10 2 |
| 54 | SELPS, P1, P2, P3, P4, P5 | See Table 3, Generator Routine 41 |
| 53 | ACTPS, P1 | See Table 3, Generator Routine 42 |
| 55 | CYCTM, P1<br>Purpose: Specify cycle time for the test being applied | P1 - value and units<br>Example:<br>CYCTM 10NS |
| 57 | DELAY, P1 | See Table 3, Generator Routine 45 |
| 56 | PGTIM, P1, P2, P3, P4<br>Purpose: Establish timing conditions | P1 - pin name<br>P2 - Flag<br>Flag Value 1 - negative pulse, return to zero<br>Flag Value 2 - negative pulse, non-return to zero<br>Flag Value 3 - positive pulse, return to zero<br>Flag Value 4 - positive pulse, non-return to zero<br>P3 - pulse width and units<br>P4 - start time and units<br>Example:<br>PGTIM A03 3 10NS 0NS |
| 58 | PATDEL, P1<br>Purpose: Identify start of specific patterns for a unique AC test | P1 - numeric which identifies the group of patterns in this test<br>1 - 1 cycle/cell<br>2 - 4 cycle/cell<br>3 - N²<br>4 - reduced N²<br>Example:<br>PATDEL 2 |
| 59 | PASDEL, P1, P2<br>Purpose: Delineate a unique set of array operations within a group of array patterns | P1 - numeric pass # (starts at 1 for each unique group of patterns)<br>P2 - # of read/write operations/cell<br>Example:<br>PASDEL 1 4 |
| 62 | PLSPN, P1<br>Purpose: Apply a pulse to a control line during a group of patterns | P1 - control pin or pins<br>Example:<br>PLSPN A05 |
| 60 | LOGST, P1, P2<br>Purpose: Apply a value to a control line or lines during a group of AC test patterns | P1 - value, units<br>P2 - control pin or pins<br>Example:<br>LOGST 2 V A05 |
| 63 | READ, P1, P2, P3, P4, P5, P6, P7<br>Purpose: Read a value from an array | P1 - current array address flag and away address flag for N² patterns<br>Flag Value 1 - ripple word address direction<br>Flag Value 2 - ripple bit address direction<br>Flag Value 3 - word direction only<br>Flag Value 4 - bit direction only<br>Flag Value 5 - grey code word direction |

TABLE 4-continued
AC UNIVERSAL LANGUAGE STATEMENTS

| GENERATOR ROUTINE | INSTRUCTION SYMBOL AND PURPOSE | FIELD DEFINITIONS AND EXAMPLE |
|---|---|---|
| | | Flag Value 6 - complemented grey code word direction |
| | | Flag Value 7 - $N^2$ skip |
| | | P2 - current address sequence flag |
| | | Flag Value 1 - increment |
| | | Flag Value 2 - decrement |
| | | P3 - home address flag for $N^2$ patterns |
| | | Flag Value 0 - no action |
| | | Remaining breakdown is the same as for P1 |
| | | P4 - home address sequence flag |
| | | Flag Value 0 - no action |
| | | Flag Value 1 - increment |
| | | Flag Value 2 - decrement |
| | | P5 - data type and start value flag |
| | | Flag Value 1 - uniform 0 |
| | | Flag Value 2 - uniform 1 |
| | | Flag Value 3 - checkerboard 0 |
| | | Flag Value 4 - checkerboard 1 |
| | | Flag Value 5 - Onebit 0 |
| | | Flag Value 6 - Onebit 1 |
| | | Flag Value 7 - data-in bars 0 |
| | | Flag Value 8 - data-in bars 1 |
| | | Flag Value 9 - colbars 0 |
| | | Flag Value 10 - colbars 1 |
| | | P6 - word address amount to be skipped for $N^2$ skip |
| | | P7 - bit address amounts to be skipped for $N^2$ skip |
| | | Example: |
| | | READ 1 1 0 0 1 0 0 |
| 65 | WRITE, P1, P2, P3, P4, P5, P6, P7<br>Purpose: Write a value into an array | P1 - current array address flag and away address flag for $N^2$ patterns |
| | | Flag Value 1 - ripple word address direction |
| | | Flag Value 2 - ripple bit address direction |
| | | Flag Value 3 - word direction only |
| | | Flag Value 4 - bit direction only |
| | | Flag Value 5 - grey code word direction |
| | | Flag Value 6 - complement grey code word direction |
| | | Flag Value 7 - $N^2$ skip |
| | | P2 - current address sequence flag |
| | | Flag Value 1 - increment |
| | | Flag Value 2 - decrement |
| | | P3 - home address flag for $N^2$ patterns |
| | | Flag Value 0 - no action |
| | | Remaining breakdown is the same as P1 |
| | | P4 - home address sequence flag |
| | | Flag Value 0 - no action |
| | | Flag Value 1 - increment |
| | | Flag Value 2 - decrement |
| | | P5 - data type and start value flag |
| | | Flag Value 1 - uniform 0 |
| | | Flag Value 2 - uniform 1 |
| | | Flag Value 3 - checkerboard 0 |
| | | Flag Value 4 - checkerboard 1 |
| | | Flag Value 5 - onebit 0 |
| | | Flag Value 6 - onebit 1 |
| | | Flag Value 7 - data-in bars 0 |
| | | Flag Value 8 - data-in bars 1 |
| | | Flag Value 9 - colbars 0 |
| | | Flag Value 10 - colbars 1 |
| | | P6 - word address amount to be skipped for $N^2$ skip |
| | | P7 - bit address amount to be skipped for $N^2$ skip |
| | | Example: |
| | | WRITE 1 1 0 0 1 0 0 |
| 64 | TEXEC, P1, P2<br>Purpose: Execute a specific AC test | P1 - execution flag |
| | | Flag Value 1 - execute until 1st fail is reached |
| | | Flag Value 2 - execute regardless of number fails |
| | | P2 - diagnostic fail # |
| | | Example: |
| | | TEXEC 1 0 25 |
| 61 | COMMENT, P1<br>Purpose: Informational command | P1 - comment |
| | | Example: |

TABLE 4-continued
AC UNIVERSAL LANGUAGE STATEMENTS

| GENERATOR ROUTINE | INSTRUCTION SYMBOL AND PURPOSE | FIELD DEFINITIONS AND EXAMPLE |
|---|---|---|
| | | COMMENT TEST ABC |

Referring now to FIG. 7 and Table 4, DIMEN Generator Routine 51 builds the DIMEN universal language statement. This statement communicates the array size and related general information. Routine 51 reads the AC array allocation menu of FIG. 3C and saves the number of word, bit, data, and control lines in the DIMEN statement. In addition the type of design (interwoven or noninterwoven) is translated into a flag field in the DIMEN statement.

ACTPS Generator Routine 53 builds the ACTPS universal language statement. This routine has been previously described with regard to Routine 42 of FIG. 6. The same routine is used here.

SELPS Generator Routine 54 builds the SELPS universal language statement. This routine has been previously described with regard to Routine 41 of FIG. 6. The same routine is used here.

CYCTM Generator Routine 55 builds the CYCTM universal language statement. This statement specifies the cycle time for the test being applied. Routine 55 uses the cycle time saved by controller 50 in the commonly accessible storage area.

PGTIM Generator Routine 56 builds the PGTIM universal language statement. This statement specifies the timing conditions to be used for the test. Routine 56 uses internal timing history tables, built by controller 50, derived from the AC Test Limits Record of FIG. 3I. The routine will analyze the select field for each pin in the pin timing table and construct a PGTIM statement for each one which is yes. The pin name and start time come directly from table fields. The pulse width is the absolute difference between the start and stop time fields in the timing table array. The flag is set based on the combination of return or non-return to zero and plus or minus polarity. A positive polarity will have a stop time greater than start time and a negative will be the opposite. The return or non-return to zero is indicated in the timing table.

DELAY Generator Routine 57 builds the DELAY universal language statement. This routine has previously been described with regard to Routine 45 of FIG. 6. The same routine is used here.

PATDEL Generator Routine 58 builds the PATDEL universal language statement. This statement identifies the start of an array test pattern set. Routine 58 contains an internal table which contains a pattern group name and a pre-assigned numeric integer. Matching is performed between the pattern group name saved by the controller from the AC test limit record of FIG. 3I and the names in the internal table array. The corresponding integer is selected.

PASDEL Generator Routine 59 builds the PASDEL universal language statement. This statement delineates a unique set of array operations within a group of array patterns. Routine 59 uses a counter which is initialized to 1 at the start of each new pattern group. The counter is updated for each new pass within a pattern group as directed by the AC test limit records of FIGS. 3I and 3J. Routine 59 also examines the counter built by controller 50 indicating the number of read/write array operations to be performed for this pass. These above two counters are then saved in the PASDEL statement.

LOGST Generator Routine 60 builds the LOGST universal language statement. This statement indicates that a logic pre-conditioning value to a control line or lines during a pass of an AC array test has been requested. The routine uses an I/O state table built by controller 50. It analyzes the table and groups the pins with a common value together. All unique values will have a LOGST issued.

COMMENT Generator Routine 61 builds the COMMENT universal language statement. This routine has been previously described in connection with Routine 49 of FIG. 6. The same routine is also used here.

PLSPN Generator Routine 62 builds the PLSPN universal language statement. This statement applies a pulse to a control line during an array test pass. Routine 62 derives the control lines to be pulsed from the internal pulse table built by controller 50.

READ Generator Routine 63 builds the READ universal language statement. This statement reads a value from an array. Routine 63 first constructs a current array address or away $N^2$ address flag. This is done by matching the caddress direction saved in a commonly accessible storage area by controller 50 against an internal table containing supported directions and corresponding flag values. Table 4 indicates the supported caddress directions and the corresponding flag values. The current address sequence flag value is derived from the cmode field saved in a common storage area by controller 50. Increment has a value of 1 and decrement a value of 2. The home address flag specifies the home addressing direction for $N^2$ type tests only. The flag is constructed using the same matching technique and address table previously discussed above. A field value of 0 is set if this is not specified in the menu. The home address sequence flag is defined only for $N^2$ processing and is derived from the hmode field saved by controller 50. The processing is similar to cmode only; a value of 0 is used if this field is not in the menu. The data type and start value flag is built by first selecting the read operation from the function table built by controller 50. The address of this function table element is passed from controller 50. A matching is performed comparing this operation against a table containing supported read operations and corresponding flag value. Table 2 shows the supported read operations. The corresponding flags are shown in Table 4. The $N^2$ skip values for the word and or bit address directions derived from the AC test limits screens (FIGS. 3I, 3J) were saved by controller 50. These skip values are used when performing reduced $N^2$ tests to allow selected away address processing. The above described flags and skip values are saved in the READ statement.

The TEXEC Generator Routine 64 builds the TEXEC universal language statement. This statement contains the test execution diagnostic information. Routine 64 sets a flag to indicate if the test is to stop when the first error is found or continue. If the diagnostic number, saved in a common area by the controller 50 is not 0, then the flag will indicate stop on first error. The diagnostic number will also be inserted in the TEXEC statement. The diagnostic fail number is derived from the AC test limits screen (FIG. 3I).

WRITE Generator Routine 65 builds the WRITE universal language statement. This statement writes a value into an array. Routine 65 first constructs a current array address or away $N^2$ address flag. This is done by matching the caddress direction saved in a commonly accessible storage area by controller 50 against an internal table containing supported address directions and corresponding flag values. Table 4 indicates the supported caddress directions and the corresponding flag values contained in the internal table. The current address sequence flag value is derived from the cmode field saved in a commonly accessible storage area by controller 50. Increment has a value of 1 and decrement a value of 2. The home address flag is used to specify the home address direction for $N^2$ tests. The flag is only used for $N^2$ type tests. The flag is constructed using the same matching technique and address table discussed above. A flag field of 0 is set if this field is not specified in the menu. The home address sequence flag is defined only for $N^2$ tests and is derived from the hmode field saved by controller 50. The processing is similar to cmode; only a 0 flag value is saved if the data is not in the menu. The data type and start value flag is built by first selecting the write operation from the function table array. The address of this function table array element is passed from controller 50. A matching is performed comparing the operation against a table supported write operations and corresponding flag values. Table 2 shows the supported WRITE operations and the corresponding flags are shown in Table 4. The $N^2$ skip values for the word and/or bit address directions derived from the AC test limit records of the data entry file (FIGS. 3I, 3J) are also saved. These skip values are used when performing reduced $N^2$ tests to allow selected away address processing.

TSTID Generator Routine 66 builds the TSTID universal language statement. This statement identifies the type of test being done. The routine saves the AC identifier in the TSTID statement.

Referring again to FIG. 5, universal language instruction sequence 16 is comprised of a combination of the DC and AC universal language statements described above in connection with Tables 3 and 4, respectively. The statements are sequenced to perform a specified DC or AC test, and sequences of statements are repeated a sufficient number of times to perform all of the DC and AC tests specified by the user. Tables 5, 6, and 7 provide examples of the universal language instruction sequences used to perform the DC Product Test, DC Test Site Test and AC Test which were illustrated as examples in the "Interactive Data Entry" section above.

TABLE 5

DC PRODUCT TEST EXAMPLE
UNIVERSAL LANGUAGE INSTRUCTION SEQUENCE

| TSTID | DC | | | | |
|---|---|---|---|---|---|
| COMMENT | TEST 1 | | | | |
| DMODE | ON | | | | |
| SELPS | VCC | 2V | 1A | STANDARD | 2V |
| SELPS | VBB | 0V | 1A | STANDARD | 2V |
| ACTPS | VCC | | | | |
| ACTPS | VBB | | | | |
| FRCPN | 800 mV | 10 MA | 2.0 V | | P2, P3 |
| FRCPN | 200 mV | 10 MA | 2.0 V | | P1 |
| DELAY | 8 mS | | | | |

TABLE 5-continued

DC PRODUCT TEST EXAMPLE
UNIVERSAL LANGUAGE INSTRUCTION SEQUENCE

| MEAPN | B | 500 μA | 100 μA | 1 | P1 |
|---|---|---|---|---|---|

TABLE 6

DC TEST SITE EXAMPLE
UNIVERSAL LANGUAGE INSTRUCTION SEQUENCE

| TSTID | DC | | | |
|---|---|---|---|---|
| COMMENT | TEST 2 | | | |
| DMODE | ON | | | |
| FRCPN | −10 μA | 100 μA | 10 V | P1 |
| FRCPN | GND | 100 μA | 10 V | P2, P3 |
| DELAY | 80 mS | | | |
| MEAPN | B | −500 mV | −700 mV | 1 | P1 |

TABLE 7

AC TEST EXAMPLE
UNIVERSAL LANGUAGE INSTRUCTION SEQUENCE

| TSTID | AC | | | | | |
|---|---|---|---|---|---|---|
| COMMENT | TEST 3 | | | | | |
| DIMEN | 7 | | 4 | 6 | 10 | 10 | 2 |
| SELPS | VCC | 0 V | 1A | STANDARD | 2 V | |
| SELPS | VBB | −2 V | 1A | STANDARD | 2 V | |
| SELPS | VEE | −5 V | 1A | STANDARD | 2 V | |
| ACTPS | VCC | | | | | |
| ACTPS | VBB | | | | | |
| ACTPS | VEE | | | | | |
| PGTIM | R1 | 3 | 20ns | 0ns | | |
| PGTIM | W1 | 3 | 20ns | 0ns | | |
| CYCTM | 100nS | | | | | |
| TEXEC | 1 | 1 | | | | |
| DELAY | 8mS | | | | | |
| COMMENT | 1 | CPC | | | | |
| PATDEL | 1 | | | | | |
| PASDEL | 1 | 1 | | | | |
| WRITE | 1 | 1 | 0 | 0 | 3 | 0 | 0 |
| PLSPN | W1 | | | | | |
| PASDEL | 2 | 1 | | | | |
| READ | 1 | 1 | 0 | 0 | 3 | 0 | 0 |
| PLSPN | R1 | | | | | |

UNIVERSAL TO TESTER TRANSLATOR SELECTOR

Referring again to FIG. 1, the details of universal to tester translator selector 18 will now be described. Translator selector 18 selects the proper universal to tester translator 19 for translation of the universal language instruction sequence 16. The translator selector 18 is activated by appropriately selecting the DC or AC Test Instruction Set option on the Background Processing Screen (FIG. 3L).

The translator selector 18 operates upon universal language source file 16, parameter file 15 and tester footprint file 17. Parameter file 15 includes data which may be obtained during interactive data entry relating to product type, part number identification, technology identification and the name of the tester to be employed. Tester footprint file 17 contains the correspondence between a particular tester's channels and the physical input/output/power supply pins on the product. There is one footprint file for each product for each tester on which the product will be tested. The footprint is created once per product and then saved.

Translator selector 18 ensures that it can link to the particular translator 19 being called out in parameter file 15 and ensures that there is a footprint for the tester and for the product from the footprint file 17. Once these checks are complete, the translator selector 18 will link to the proper translator 19.

It will be recognized by those having skill in the art that the data for parameter file 15 and tester footprint file 17 may be entered during the interactive data entry phase (described above) or may be entered prior to or after the interactive data entry phase. Moreover, it will also be realized by those having skill in the art that the universal to tester translator selector 18 need not be a computer program per se. Specifically, selection of the appropriate translator 19A . . . 19X may be performed by the operator who physically links the appropriate translator to the universal language source file 16. In that case, the operator would have to provide an appropriate tester footprint file to the selected translator.

Whether done manually by the operator or automatically by translator selector 18, the vertical language instruction sequence 16, appropriate parameters from parameter file 15, and an appropriate tester footprint file 17 are made available to the selected translator 19A . . . 19X.

UNIVERSAL TO TESTER TRANSLATOR

Figure 8:
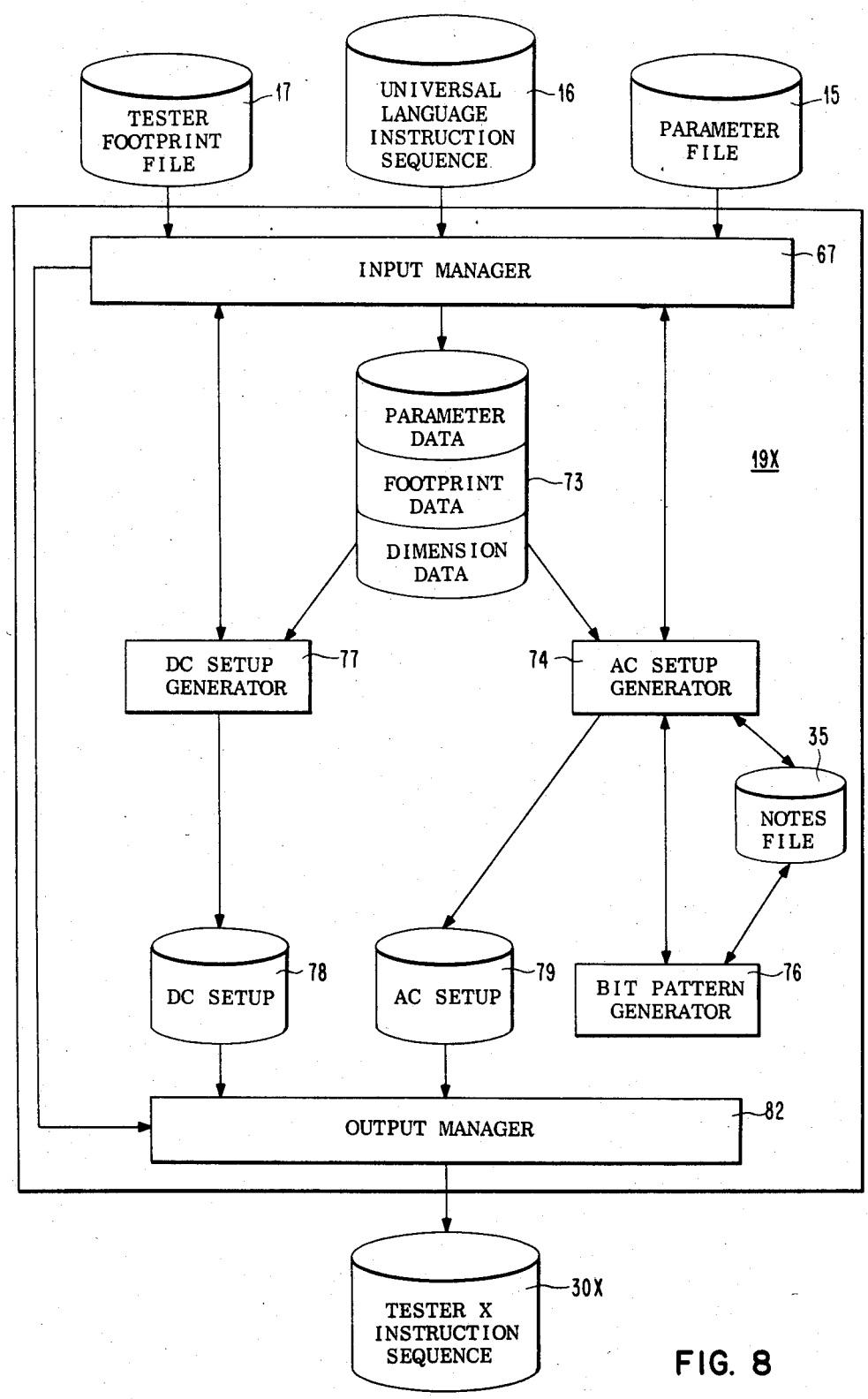
FIG. 8 illustrates a universal to tester translator which may be employed in FIG. 1.

Referring now to FIG. 8, the details of a typical universal to tester translator 19 is described. FIG. 8 illustrates a typical translator 19. However, it will be realized by those having skill in the art that for other testers, the configuration of translator 19 may vary.

Referring again to FIG. 8, translator 19 includes an input manager 67 which serially reads universal language instructions from universal language instruction sequence 16 and appropriately links to DC setup generator 77, AC setup generator 74 or otherwise processes the universal language source statement. Input manager 67 also performs the initial processing of the footprint and parameter file (17 and 15, respectively) and creates a small readily usable file 73 of parameter and footprint data. It also adds selected universal language statement data to file 73, e.g., the data found in the DIMEN source statement (Table 4). This data is common to both DC and AC setup processors. Therefore, it is most expedient to have input manager 67 decompose this statement and make the data easily accessible by either processor. Input manager 67 also tracks where control is currently being retained so that when a universal language source statement common to both AC and DC tests is encountered (e.g., the SELPS instruction), the proper processing and linkage thereof occurs.

DC setup generator 77 will be invoked whenever input manager 67 encounters a TSTID statement with its field specifying DC testing. DC setup generator 77 generates the necessary tester instructions for performing the DC tests specified in universal source file 16. The generated DC tester instructions are stored in DC setup file 78.

AC setup generator 74 is invoked when input manager 67 encounters a TSTID statement with its field specifying AC testing. AC setup generator 74 generates the necessary tester instructions for performing AC testing on the product. The appropriate AC tester instructions are stored in AC setup file 79. AC setup generator 74 also coordinates the invocation of bit pattern generator program 76 and monitors the patterns that have been created for timing and voltage test cases requested by the system user.

Notes file 75 is a communication vehicle between AC setup and bit pattern generators 74 and 76, respectively. Notes file 75 records each type of bit pattern test generated (checkerboard, 4 cycle/cell, . . . etc.) and the kind of addressing specified for that test (increment/decrement, word major/bit major). Notes file 75 retains a copy of the relevant portions of the tester memory for each of these combinations and a directory so that any combination may be retrieved. The appropriate data is retrieved from the Notes file 75 and written to the AC setup file 79 whenever a test is called for which bit patterns have already been generated. In this way common sets of patterns do not need to be continuously regenerated. The need for pattern re-use is common, for example, when the same pattern sequence is required for several voltage or timing cases.

Bit pattern generator 76 generates the particular bit patterns which cause the tester to systematically exercise the array memory cells. The dimension data stored in file 73 is employed by bit pattern generator 76 in order to generate bit patterns. Examples of such dimension data is the number of word address lines, the number of bit address lines, the number of control lines for the memory, etc. From this data and known characteristics of the tester, bit pattern generator 76 is able to generate many different bit patterns. Common bit pattern test data will be repeated on the bit pattern file each time a new AC setup is required. For example, the same 4-cycle per cell bit pattern test may be required for each of four different voltage setups. In this case, the 4-cycle per cell bit patterns are repeated three times.

Output manager 82 generates the complete tester instruction set 30, by combining both AC setup 79 and DC setup 78 files.

In order to more particularly describe the detailed processing that occurs within translator 19 a hypothetical tester will now be described. Then, the manner in which translator 19 translates the universal language instruction sequence 16 into the hypothetical tester instruction sequence will be described. It will be understood by those having skill in the art that every tester accepts a unique tester instruction set so that the design of a translator will be unique for every tester. It will also be realized by those having skill in the art that different testers may accept a higher or lower level of instructions so that the translator design may be more simple or more complicated from that described here.

Figure 9:
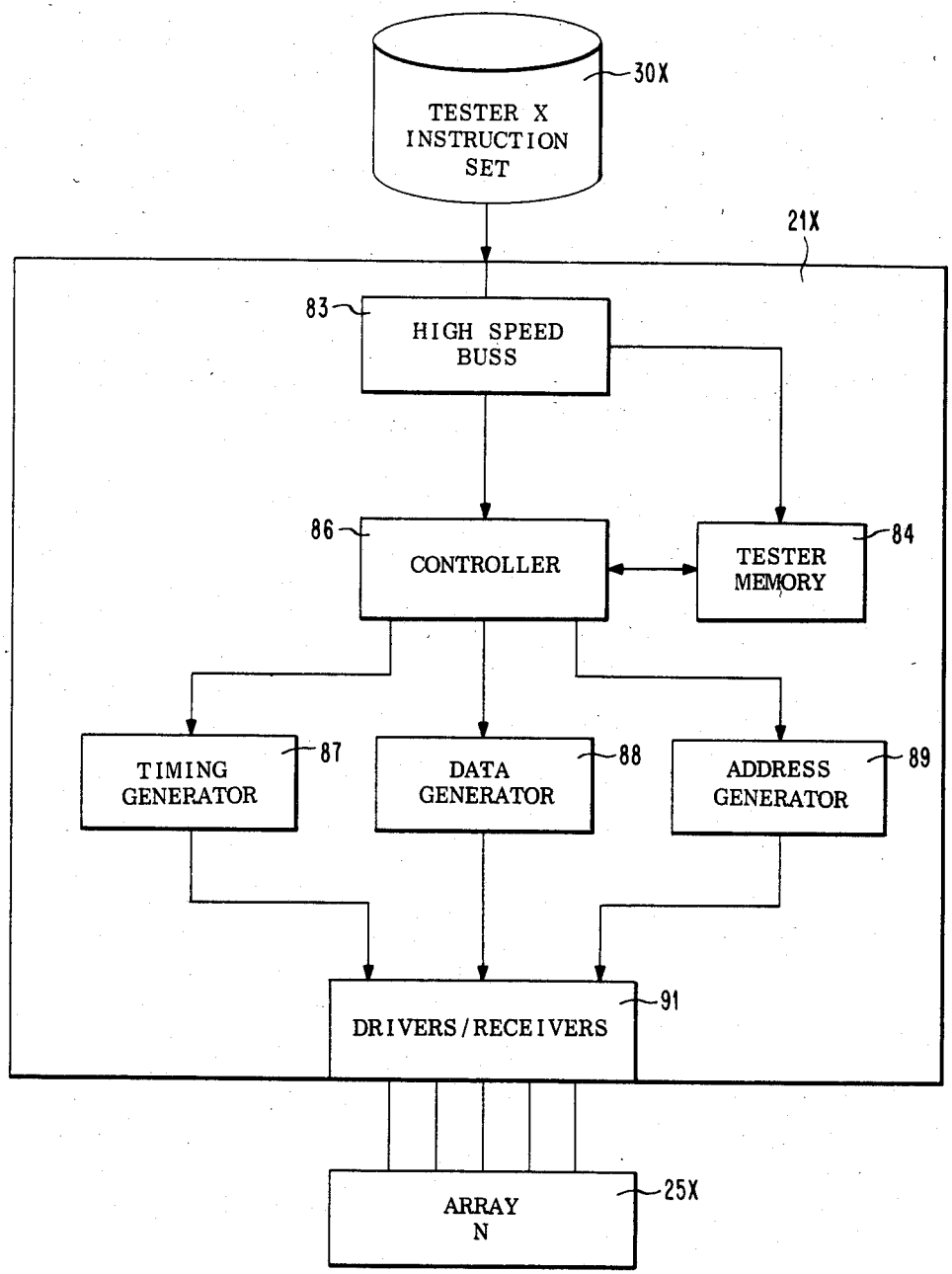
FIG. 9 illustrates a typical array tester which may be employed in FIG. 1.

Referring now to FIG. 9, the hardware architecture of a typical general purpose memory tester is illustrated. Tester 21X is driven by an instruction sequence that controls both the operating system of the tester and all the tests to be performed on array 25X. These instructions are stored in tester memory 84 via high speed buss 83. The tester is controlled by a microprocessor or other controller 86 and includes a timing generator 87, data generator 88 and address generator 89. The appropriate tester instructions in tester memory 84 are transmitted to generators 87, 88 and 89 by controller 86 to thereby form sequences of binary voltage levels which are output to the array under test 25X via drivers/receivers 91. The architecture of a typical tester 21 does not form a part of the present invention and will not be described in further detail.

In order to illustrate the translation of universal language instruction sequences into a tester instruction sequence 30, the translation of the universal language instruction sequences for the DC Product, DC Test Site and AC Test Examples of Tables 5-7, will now be described. Table 8 illustrates the DC Product Test Example universal language instruction sequence (identical to Table 5) and the corresponding DC Product Test Example tester instruction sequence.

TABLE 8

| DC PRODUCT TEST EXAMPLE UNIVERSAL LANGUAGE INSTRUCTION SEQUENCE | DC PRODUCT TEST EXAMPLE TESTER INSTRUCTION SEQUENCE |
|---|---|
| TSTID DC | FF00 <br> 0701 XXXX <br> 0702 XXXX <br> . <br> . <br> 0709 XXXX |
| COMMENT TEST 1 | |
| DMODE ON | 9201 |
| SELPS VCC 2 V <br> 1A STANDARD 2 V | 0204 0330 <br> 0844 <br> 0404 0330 |
| SELPS VBB 0 V <br> 1A STANDARD 2 V | 0202 0330 <br> 0842 <br> 0402 0000 |
| ACTPS VCC | 0641 |
| ACTPS VBB | 0621 |
| FRCPN 800 MV <br> 10 MA 2.0 V P2, P3 | 0AC2 0200 <br> 0BC2 0020 <br> 0DC2 3204 <br> 0AC3 0200 <br> 0BC3 0020 <br> 0DC3 3204 |
| FRCPN 200 MV <br> 10 MA 2.0 V P1 | 0AC1 0200 <br> 0BC1 0020 <br> 0DC1 0C84 |
| DELAY 8 mS | 9105 0008 |
| MEAPN B 500 μa 100 μa 1 P1 | 9301 <br> 0C011F43 <br> 0C020643 <br> 17C1 |

The manner in which the DC Product Test Example universal language instruction sequence is processed by translator 19 to generate the DC Product Test Example tester instruction sequence (Table 8) will now be described. Referring again to FIG. 1, universal to tester translator selector 18 determines the tester to be used and the product identification from parameter file 15 and accesses the corresponding tester footprint from tester footprint file 17. The appropriate translator 19 is selected and control is passed to input manager 67 (FIG. 8).

Referring again to FIG. 8, input manager 67 begins sequencing through the universal source statements in the left hand column of Table 9. The first statement encountered is TSTID DC. Input manager 67 retains this entire statement until the next TSTID statement is encountered. With each subsequent read of a universal language source file statement, input manager 67 checks the statement symbol. If it is TSTID, input manager 67 replaces the old TSTID statement with the new TSTID. Control is linked to DC setup generator 77 or AC setup generator 74, and a tester setup instruction FF00 is issued. DC setup generator will do some preliminary register setting (0701 XXXX, etc.), to anticipate DC testing environment. AC setup generator 74 will do the same, anticipating AC testing environment (0701 YYYY). The tester op codes are all represented in hexadecimal on the right hand column of Table 8. If the statement symbol is not TSTID, the input manager links to either the AC setup or DC setup generator, depending upon the most recent TSTID value stored by input manager 67.

The next universal language source statement encountered is the COMMENT statement. This is an optional informational aid only. The COMMENT data is printed to a system listing but is not further processed.

The next statement presented to DC setup generator 77 is the DMODE statement. This statement causes DC setup generator 77 to generate the op codes necessary to cause the tester to abort the DC test if a fail occurs on any digital voltmeter compare. The next statement is a SELPS statement which defines a power supply. This statement causes the DC setup generator to load current compliance, current range and supply digital to analog converters for the appropriate power supply. Table 8 shows the tester op code expansion done by DC setup generator 77 for both SELPS $V_{CC}$ and SELPS $V_{BB}$. Each SELPS statement expands to 3 tester instructions. They are:

'02' load current compliance digital to analog converter

'08' load power supply current range

'04' load power supply digital to analog converter

The tester power supply to be used is defined in the low-order 4 bits of tester instruction byte 2. Through the use of the footprint file 73, DC Setup Generator 77 is able to convert $V_{CC}$ to power supply 4 and $V_{BB}$ to power supply 2. The high-order bit setting of byte-2 of tester instruction '08' indicates that the 1 amp current range will be used. The value portions of tester instructions '02' and '04' (bytes 3 and 4) are generated based upon a 12-bit digital to analog converter power supply table:

| | |
|---|---|
| Bit 15: | + 0.0024 Least significant bit |
| 14: | + 0.004 |
| 13: | + 0.010 |
| 12: | + 0.020 |
| 11: | + 0.040 |
| 10: | + 0.078 |
| 9: | + 0.156 |
| 8: | + 0.312 |
| 7: | + 0.625 |
| 6: | + 1.25 |
| 5: | + 2.5 |
| 4: | + 5.0 Most significant bit |

The next instruction received is the ACTPS statement. Tester instructions to activate $V_{CC}$ and $V_{BB}$ power supplies are generated and then the FRCPN statement is encountered. The first FRCPN command instructs DC setup generator 77 to generate the instructions necessary to set up a digital to analog converter with a 10 mA range and a clamping of 2.0 v; then to force a value of 800 mV on pins P2 and P3. To accomplish this, DC setup generator 77 generates an "A register load" (0A op code) to setup the digital to analog converter to the 10 mA range for pin P2. Then a "B register load" (0B op code) is generated to set the digital to analog conveter clamp value to the 2.0 v range. Then the digital to analog converter is loaded with the 800 mV value through the 0D tester op code. These three instructions are then repeated for pin P3. The composition of the value portions of '0B' and '0D' op codes are as follows:

bits 16–27 contain the value bits 28–30 contain '010' if 'milli' '001' if 'micro' bit 31 is '0' if value is in volts '1' if value is in amps.

Again, through the use of the footprint file 73, DC Setup Generator 77 converts pins P1, P2, and P3 to tester channels C1, C2, and C3.

The value portion of the '0A' op code is based upon a table where:

| if the clamping condition is: | then the value is: |
|---|---|
| 100 MA | 0800 |
| 10 MA | 0200 |
| 1 MA | 0100 |
| 100 µA | 0080 |
| 10 µA | 0040 |
| 1 µA | 0020 |

The second FRCPN statement is processed in a manner similar to that described above. The next statement is the DELAY statement. Op code 91 is the tester op code for delaying processing, the 05 code is the unit of measure in milliseconds and the value of 8 is assigned to the second half-word of the instruction. Finally, the MEAPN statement causes DC setup generator 77 to generate the necessary instructions to measure P1 between a high limit of 500 microamps and a low limit of 100 microamps. Tester op code 93 tells the tester which sort bit to set when a DC fail occurs for this test. In our example, the sort bit is equal to 1. The tester command to load a limit is 0C. The second byte is set to 01 for loading a high limit and is set to 02 for loading a low limit. The next twelve bits are the value setting and the last four bits reflect a unit of measure.

The final tester instruction is the op code to cause the plus side of the digital volt meter to be moved to pin P1 and generate a reading. The op code to do this is 17. When instruction 17C1 is executed by the tester, a reading will be made on pin P1 based on the above forcing conditions to P1, P2 and P3. The tester will compare the reading to the limit specified. If the reading is within the limits, the test was successful. If not, a DC failure will result and the failure will be logged according to the above 93 op code. This completes the description of the translation of the DC Product Test Example universal language instruction sequence into the DC Product Test Example tester instruction sequence (Table 8).

For the DC Test Site example shown in Table 6 expansion of universal language instruction is done in the same manner as for DC test. The TSTID instruction dictates to input manager 67 that this is a DC test. Input manager saves this information and will continuously call DC setup generator 77 until the next TSTID instruction is encountered. Table 9 shows the expansion done by DC setup generator 77 on the DC test site example.

TABLE 9

| DC PRODUCT TEST SITE EXAMPLE UNIVERSAL LANGUAGE INSTRUCTION SEQUENCE | DC PRODUCT TEST EXAMPLE TESTER INSTRUCTION SEQUENCE |
|---|---|
| TSTID DC | FF00<br>0701 XXXX<br>0702 XXXX<br>.<br>.<br>0709 XXXX |
| COMMENT TEST 2<br>DMODE ON | 9201 |
| FRCPN −10 µA<br>100 µA 10 V P1 | 0AC1 0800<br>0BC1 00A0<br>0DC1 FF63 |
| FRCPN GND 100 µA<br>10 V P2, P3 | 0AC2 0080<br>0BC2 00A0<br>0DC2 0000<br>0AC3 0080<br>0BC3 00A0<br>0DC3 0000 |
| DELAY 80 mS | 9105 0050 |
| MEAPN B −500 MV<br>−700 MV 1 P1 | 9301<br>0C01 E0C4<br>0C02 D444<br>17C1 |

Referring now to Table 10, the translation of the AC test universal language source file example of Table 7 into an AC test tester instruction set is illustrated.

TABLE 10

| AC TEST EXAMPLE UNIVERSAL LANGUAGE INSTRUCTION SEQUENCE | AC TEST EXAMPLE TESTER INSTRUCTION SEQUENCE |
|---|---|
| TSTID AC | FF00<br>0701 YYYY<br>0702 YYYY<br>.<br>.<br>0709 YYYY |
| COMMENT TEST 3<br>DIMEN 7 4 6 10 10 2 | See Table 11 |
| SELPS VCC 0 V 1A STANDARD 2 V | 0204 0330<br>8444<br>0404 0000 |
| SELPS VBB −2 V 1A STANDARD 2 V | 0202 0330<br>0842<br>0402 0CD0 |
| SELPS VEE −5 V 1A STANDARD 2 V | 0201 0330<br>0841<br>0401 0800 |
| ACTPS VCC<br>ACTPS VBB<br>ACTPS VEE | 0641<br>0621<br>0611 |
| PGTIM R1 3 20nS 0nS | A0RD E800<br>C0A0 3C00 |
| PGTIM W1 3 20nS 0nS | A0WT 9800<br>C020 3C00 |
| CYCTM 100nS<br>TEXEC 1 1<br>DELAY 8mS<br>COMMENT 1 CPC<br>PATDEL 1 | 8500 0064<br>2281 0000<br>9105 0008 |

TABLE 10-continued

| AC TEST EXAMPLE UNIVERSAL LANGUAGE INSTRUCTION SEQUENCE | AC TEST EXAMPLE TESTER INSTRUCTION SEQUENCE | |
|---|---|---|
| PASDEL 1 1 | | |
| | 0701 0001 | Preset start register to 1 |
| | 0702 0008 | Preset end of test register |
| | 0703 0001 | Preset # of loads required to write checkerboard pattern |
| WRITE 1 1 0 0 3 0 0 | 8100 | Load A & B memories |
| | 0000 0000 0000 | Test patterns for write |
| | 0000 0000 0000 | |
| | . . . | |
| | AA00 | Execute AC Test (Write checkerboard) |
| PLSPN W1 | AA00 | |
| PASDEL 2 1 | | |
| | 0701 0001 | Preset start register to 1 |
| | 0702 0008 | Preset end of test register |
| | 8100 | Load A & B memories |
| READ 1 1 0 0 3 0 0 | 0000 0000 0000 | Test Patterns for read |
| | 0000 0000 0000 | |
| | . . . | |
| | AA00 | Execute AC Test (Read checkerboard) |
| PLSPN R1 | AA00 | |

At the conclusion of expansion of the DC product or test site test, Table 8 or 9, the next statement encountered by input manager 67 is TSTID AC. As with all other universal language source statements, input manager 67 checks this statement against the TSTID value stored. This compare will result in a match, with the operand AC being stored. Then because AC is now stored, input manager 67 links to AC setup generator 74. The TSTID statement causes AC setup generator 74 to generate the tester op code for beginning executing AC testing, i.e., op code FF00. It will be noted that this is the same as the start command for DC testing. Control is then returned to input manager 67 and the COMMENT statement is processed as was described above for the DC Product test (Table 8). Next, input manager 67 encounters the DIMEN statement. Input manager 67 creates a record in file 73 from this statement, according to the format of Table 11. This record is now accessible by AC setup generator and bit pattern generator (74 and 76, respectively).

TABLE 11

| Byte # | DIMENSION DATA RECORD | |
|---|---|---|
| 01 | "DIMEN" | Dimension Data i.d. |
| 10 | 7 | # Word Address Lines |
| 14 | 4 | # Bit Address Lines |
| 18 | 6 | # Control Lines |
| 22 | 10 | # Data-In Lines |
| 26 | 10 | # Data-Out Lines |
| 30 | 2 | Interwoven/Non-Interwoven |

The next six universal language source statements (i.e., three SELPS and three ACTPS instructions in Table 10) contain the same data fields as their DC counterparts. They are processed in the same manner by AC setup generator 74. The next two universal language source statements (i.e., two PGTIM instructions in Table 10) set up timing conditions for read control pin R1 and write control pin W1. Both have a positive, return to zero pulse, and both have a pulse width of 20 nanoseconds and a start time at 0 nanoseconds. Each PGTIM instruction causes AC setup generator 74 to generate two tester instructions, the first an A0 and the second a C0. The A0 instruction sets a positive or negative polarity, selects a read or write timing generator from the four available for read control and the four available for write control. Finally, A0 tells the timing generator if the mode is return to zero or non-return to zero. The C0 tester instruction describes a pulse width and start time for the read and write lines. The AC setup generator 74 also uses the footprint file 73 to connect the read control pin R1 to tester channel RD and write control pin W1 to tester channel WT.

The next universal language source statement (Table 10) is CYCTM. This statement sets the tester cycle time for the test. Then, the TEXEC statement is read. This command generates tester instructions to govern AC diagnostic for an upcoming test. AC setup generator 74 generates an op code 22 which according to the TEXEC statement will skip out of the test when the first failure occurs and will log the failure as a 1. Op code data bit 0 will be set to 1 to indicate skip out on first fail while data bits 1-7 will be set to 1 to indicate the class of error and data bits 8-23 will be set to 0 since the mode is stop on first fail. The next statement encountered is the DELAY statement. AC setup generator 74 processes this statement the same as DC setup generator 77. The COMMENT statement will be handled in the same manner as for DC setup (Table 8).

The PATDEL statement is the first command encountered which causes AC setup generator 74 to forward control to bit pattern generator 76. Bit pattern generator 76 extracts the information it needs from the PATDEL statement. Then, bit pattern generator 76 receives the PASDEL statement. This tells bit pattern generator 76 that this is pass number 1 and that there will be 1 read/write operation per array cell. The PATDEL and PASDEL statements do not cause any op codes to be generated. Their purpose is to pass necessary bit pattern generation information to the bit pattern generator. The last piece of information which bit pattern generator needs prior to generating the required bit pattern is the WRITE statement. The WRITE statement specifies that addressing will be in the word direction and that it will be incremental. The WRITE statement also tells bit pattern generator 76 that the start value is zero. This statement data together with the array dimension data on file is all the information which bit pattern generator 76 needs to generate the test pattern.

The information required to generate the 1 cycle per cell bit pattern is derived by bit pattern generator 80 as follows: The size of the array is derived from the number of word addresses, bit addresses, and the number of data lines. In the present example, the size is 128×16×10 or 20K, derived from the seven word address lines, four bit address lines and ten data lines. The WRITE statement also specifies that addressing priority should be in the word direction which means that the word lines all must change before the bit address line changes. The WRITE statement also provides the addressing direction which in this particular example is incremental. This means that processing begins at word address=0 and bit address=0 as opposed to word address=127 bit address=15. The WRITE statement also conveys the information that the writing into the array is in a checkerboard pattern beginning with the value 0. FIG. 10 illustrates the above described derivation of the bit pattern generation data for the memory array of the present example.

Prior to describing generation of the bit pattern of the present example by bit pattern generator 76, a more detailed description of the tester memory 84 (FIG. 9) will be presented. For this particular example, it will be assumed that the tester memory 85 includes two data matrices with a total of 18,432 bits. Each data matrix is organized as a 36 bit by 256 word array. The data matrices will be referred to as the A and B memories. The 36 bit dimension of the A and B memory comprises data bits, address bits and control bits. There are several modes of operation available. For the present example, it is assumed that the A memory cycles sequentially between the value contained in a start register and the value programmed using the A memory control bits. Memory transitions occur at each clock cycle. The B memory cycles sequentially between words 0 and 255. The time of change in B memory from a word to the next sequential word is controlled by the A memory program control field. The control field bits of the A and B memory are as follows: The A control bits comprise an increment B bit (INC B), an A branch bit (BRN) and an end of program marker (PTR). The INC B bit tells the tester when to increment to the next word in the B memory. The BRN bit signals the tester to branch to the A memory address specified in the start register, and the PTR bit marker instructs the tester that the end of the program has been reached or that a reload of the start register may be performed.

The B memory control bits comprise a store command bit (STR), a select command bit (SEL), and a pass-through bit (PAS). The STR bit specifies the A memory address to be stored into the start register. The SEL bit works with the BRN command to specify the start register S1 or S2. It also operates with STR to specify S1 or S2. For the checkerboard example being described here, only 1 start register is required to be programmed. For other bit pattern applications two start registers must be employed in the programming. The PAS bit is programmed similar to BRN. The A memory address passed to is two greater than the one which appears simultaneously with PAS=1. Instruction timing occurs on every second clock cycle. Table 12 illustrates the complete layout of the A and B memories.

TABLE 12

| Bits | A and B Memory Formats |
|---|---|
| | Purpose |
| A-Memory (36 bits × 256 words) | |
| 1-22 | data bits |
| | 1-10 used; 1 for each data line |
| | 11-22 unused |
| 23-30 | unused |
| 31-36 | control bits |
| | 31 Block (do not allow) write |
| | 32 Block (do not allow) read |
| | 33 cycle |
| | 34 INC-B |
| | 35 BRN-A |
| | 36 PTR |
| B-Memory (36 bits × 256 words) | |
| 1-21 | data bits - unused |
| 22 | cycle trip |
| 23-33 | address bits |
| | 23-29 word bit address lines |
| | 30-33 bit address lines |
| 34-36 | control bits |
| | 34 STR |
| | 35 SEL |
| | 36 PAS |

FIG. 11 illustrates a shorthand simulated version of the checkerboard bit patterns generated by bit pattern generator 76 (FIG. 8). By this it is meant that A memory will contain words 0, 1, 2, . . . 3, 2 and not 0, 1, 2, 1, 2, . . . 31, 32, 31, 32. FIG. 11 illustrates memory addresses 0-4, however, it will be understood by those having skill in the art, that to fully write the array with a checkerboard pattern requires 32 A memory words and 256 B memory words. To read the entire checkerboard pattern requires an additional 32 words of A memory.

After creating the bit patterns, bit pattern generator 76 writes the bit patterns into the Notes file 75. This is done in anticipation of future bit pattern requirements in the same AC test which may require the same A memory and/or B memory patterns. This is probable when the same patterns are required for several different voltage or timing cases. When this occurs, bit patterns can be retrived and repeated rather than being regenerated each time.

Referring again to FIG. 11, the contents of the A and B memory and the manner in which checkerboard bit patterns are generated from these memories by tester 21 will be described. The cycle bit of the A and B memories determine how many times the tester must cycle through the A and B memory. Whenever the cycle bits of the A and B memories match, two things will occur. First, the preset number of cycles register is reduced by 1. When this register count becomes zero, the tester will stop processing bit patterns and process the next tester op code. Second, the array addressing is incremented as programmed. In this example, the bit direction address is increased. For this checkerboard example, the A and B memory cycle bits will match at B memory addresses 0 and 128. The tester circuitry is set up in such a way as to ignore the first occurrence or the first matching condition. Therefore, the checkerboard patterns will be applied first to word addresses 0-127, bit address 0. At word 128, the next match occurs. This causes the word address line to reset to 0 and the bit address lines to be increased by 1. Thus, there will be a complete cycle through the word addresses for each bit address. To write through the entire array will require eight matches. This is an essential piece of information to the tester, because it communicates the number of times the tester must cycle through B memory in order to complete the writing into the array. This data (end-of-test) is sent to AC setup generator 74 which then writes out to the AC setup 79 file the necessary tester instructions (see Table 10) so that end of test can be properly sensed. To complete the checkerboard write and read, 16 matches are required. FIG. 11 represents the subset of the patterns necessary to perform the write portion of the test. This is reflected in the settings of the block write/read bits; i.e., the block write bit is 0 and the block read bit is 1 indicating write only. To write a checkerboard pattern into the 128×16×10 array of our example, will only require one load, i.e., ≦256 A memory or B memory words. The number of loads required to perform the WRITE is communicated to AC setup generator 74 which generates the appropriate tester instructions (see Table 10) and writes the instructions into AC setup file 79.

The tester instructions to load the A memory and B memory are next. First bit pattern generator 76 checks to determine if this set of bit patterns has been written to the Notes file 75. It determines that these patterns are not as yet on the Notes file so bit pattern generator 76 writes these patterns to the Notes file. Next bit pattern generator 76 communicates to AC setup generator 74 to write the patterns to AC setup file 79. Bit pattern generator 76 tells AC setup generator 74 where the proper bit patterns are located on the Notes file. AC setup generator 74 then writes out a load command (op code 81, Table 10) and the bit patterns from the Notes file (see Table 10). All writing of bit patterns will be done in the same manner: bit pattern generator 76 will either generate the patterns and write them to Notes file or find them already in Notes file. In either case, bit pattern generator 76 will return to AC setup generator 74 with instructions to issue a load command and with a pointer to the Notes file for the proper patterns to load.

Control is now returned to the input manager 67 (FIG. 8). The next statement (Table 10) is processed. It is the PLSPN statement. This statement will actually cause tester execution of the write bit patterns already loaded into A and B memories. PLSPN is sent to AC setup generator 74 for translation. AC setup generator 74 converts PLSPN to the op code AA which means execute AC testing. Finally, processing of the remaining PASDEL, READ and PLSPN commands of Table 10 are the same as for the write pass described above with regard to Table 10 because the READ operation requires the same patterns as the WRITE except for the "block read" and "block write" settings in A memory. The start register and the end of processing registers must also be reset. Table 10 details these operations for the READ statement.

Thereafter, control is returned to input manager 67 (FIG. 8) which determines that there are no more commands to process. Input manager 67 then passes control to output manager 82 with parameters indicating that both DC and AC test data has been generated. Output manager 82 simply concatenates the DC and AC test into a single tester instruction sequence 30X. At the end of each DC and AC test an ENDTEST instruction is inserted by output manager 82 to indicate that the tester should stop processing instructions.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. A system for automatically testing an integrated circuit memory array solely on one of a plurality of different array testers, comprising:
    an interactive data entry device for entering tester independent characterizing information, DC testing parameters, AC testing parameters and AC test pattern choices for said array;
    a universal language generator for generating a tester independent universal language instruction sequence for carrying out DC parametric tests, AC parametric tests and AC pattern tests for said array, based upon said characterizing information, DC testing parameters, AC testing parameters and AC test pattern choices;
    a plurality of universal to tester translators, each of which is associated with a respective one of said plurality of different array testers, for translating the entirety of said tester independent universal language instruction sequence into a respective tester dependent instruction sequence for carrying out said DC parametric tests, AC parametric tests, and AC pattern tests for said array on the associated tester; and,
    means for applying said tester dependent instruction sequence to the associated tester to cause the associated tester to test said array thereon.

2. The system of claim 1 further comprising a data entry manager for controlling the interactive entry of tester independent characterizing information, DC testing parameters, AC testing parameters and AC test pattern choices on said interactive data entry device.

3. The system of claim 2 wherein said data entry manager audits the interactively entered tester independent characterizing information, DC testing parameters, AC testing parameters and AC test pattern choices for completeness and consistency.

4. The system of claim 1 further comprising a universal to tester translator selector for routing said tester independent universal language instruction sequence to the appropriate one of said plurality of universal to tester translators.

5. The system of claim 1 wherein said universal language generator comprises a universal language generator controller for accepting the interactively entered tester independent characterizing information, DC testing parameters, AC testing parameters and AC test pattern choices; a DC universal language generator for generating the universal language instruction sequence for carrying out said DC parametric tests; and an AC universal language generator for generating the universal language instruction sequence for carrying out said AC parametric test and AC pattern tests.

6. The system of claim 1 wherein each of said universal to tester translators includes an input manager for accepting the tester independent universal language instruction sequence; a DC setup generator for generating the tester dependent instruction sequence for carrying out said DC parametric tests; an AC setup generator for generating the tester dependent instruction sequence for carrying out said AC parametric tests; and a bit pattern generator for generating the tester dependent instruction sequence for carrying out said AC pattern tests.

7. A method of automatically testing one of a plurality of arrays of varying configurations solely one one of a plurality of array testers of varying designs by operating one or more computers to carry out the steps of:
presenting menus on an interactive data entry device, for entry therein of tester independent characterizing information, DC testing parameters, AC testing parameters, and AC test pattern choices for an array to be tested;
generating a tester independent universal language instruction sequence based upon said characterizing information, DC testing parameters, AC testing parameters, and AC test pattern choices;
translating the entirety of said tester independent universal language instruction sequence into a respective tester dependent instruction sequence which is compatible with the particular array tester to be employed; and,
applying said tester dependent instruction sequence to the particular array tester to be employed, to thereby test said array thereon.

8. The method of claim 7 wherein the following step is carried out between said menu presenting step and said generating step:
auditing the tester independent characterizing information, DC testing parameters, AC testing parameters and AC test pattern choices for completeness and consistency.

9. The method of claim 7 wherein said applying step comprises the step of loading said tester dependent instruction sequence into the tester memory of the particular array tester to be employed.

10. A system for automatically testing an integrated circuit memory array solely on one of a plurality of different array testers, comprising:
a data entry device for entering therein tester independent test specifications for said array;
a universal language generator for generating a tester independent universal language instruction sequence for carrying out prescribed tests for said array, based upon the entered test specifications;
a plurality of universal to tester translators, each of which is associated with a respective one of said plurality of different array testers, for translating the entirety of said tester independent universal language instruction sequence into a respective tester dependent instruction sequence for carrying out said prescribed tests for said array on the associated tester; and,
means for applying said tester dependent instruction sequence to the associated tester to cause the associated tester to test said array thereon.

11. The system of claim 10 wherein said data entry device is an interactive data entry device.

12. The system of claim 11 further comprising a data entry manager for controlling the interactive entry of said tester independent test specifications on said interactive data entry device.

13. The system of claim 12 wherein said data entry manager audits the entered tester independent test specifications for completeness and consistency.

14. The system of claim 10 wherein said tester independent test specifications comprise characterizing information, DC testing parameters, AC testing parameters and AC test pattern choices for said array, and wherein said prescribed tests comprise DC parametric tests, AC parametric tests and AC pattern tests for said array.

15. The system of claim 14 wherein said universal language generator comprises a universal language generator controller for accepting the entered tester independent characterizing information, DC testing parameters, AC testing parameters and AC test pattern choices; a DC universal language generator for generating the universal language instruction sequence for carrying out said DC parametric tests; and an AC universal language generator for generating the universal language instruction sequence for carrying out said AC parametric tests and AC pattern tests.

16. The system of claim 14 wherein each of said universal to tester translators includes an input manager for accepting the tester independent universal language instruction sequence; a DC setup generator for generating the tester dependent instruction sequence for carrying out said DC parametric tests; an AC setup generator for generating the tester dependent instruction sequence for carrying out said AC parametric tests; and a bit pattern generator for generating the tester dependent instruction sequence for carrying out said AC pattern tests.

17. The system of claim 10 further comprising a universal to tester translator selector for routing said tester independent universal language instruction sequence to the appropriate one of said plurality of universal to tester translators.

18. A method of automatically testing one of a plurality of arrays of varying configurations solely on one of a plurality of array testers of varying designs by operating one or more computers to carry out the steps of:
providing means for entering tester independent test specifications for an array to be tested;
generating a tester independent universal language instruction sequence based upon the entered test specifications;
translating the entirety of said tester independent universal language instruction sequence into a respective tester dependent instruction sequence which is compatible with the particular array tester to be employed; and,
applying said tester dependent instruction sequence to the particular array tester to be employed, to thereby test said array thereon.

19. The method of claim 18 wherein said providing step comprises the step of presenting menus on a data entry device for entry therein of tester independent test specifications for an array to be tested.

20. The method of claim 18 wherein said tester independent test specifications comprise characterizing information, DC testing parameters, AC testing parameters and AC test pattern choices for said array.

21. The method of claim 19 wherein said data entry device is an interactive data entry device.

22. The method of claim 18 wherein the following step is carried out between said providing step and said generating step:
auditing the tester independent test specifications for completeness and consistency.

23. The method of claim 18 wherein said applying step comprises the step of loading said tester dependent instruction sequence into the tester memory of the particular array tester to be employed.

24. A system for automatically generating an instruction sequence for testing an integrated circuit memory array solely on one of a plurality of different array testers, comprising:
a data entry device for entering tester independent test specifications for said array;

a universal language generator for generating a tester independent universal language instruction sequence for carrying out prescribed tests for said array, based upon the entered test specification; and a plurality of universal to tester translators, each of which is associated with a respective one of said plurality of different array testers, for translating the entirety of said tester independent universal language instruction sequence into a respective tester dependent instruction sequence for carrying out said specified tests for said array on the associated tester;

whereby said tester dependent instruction sequence may be applied to the associated tester to cause the associated tester to test said array thereon.

25. The system of claim 24 wherein said data entry device is an interactive data entry device.

26. The system of claim 25 further comprising a data entry manager for controlling the interactive entry of said tester independent test specifications on said data entry device.

27. The system of claim 26 wherein said data entry manager audits the entered tester independent test specifications for completeness and consistency.

28. The system of claim 24 wherein said tester independent test specifications comprise characterizing information, DC testing parameters, AC testing parameters and AC test pattern choices for said array and wherein said prescribed tests comprise DC parametric tests, AC parametric tests and AC pattern tests for said array.

29. The system of claim 28 wherein said universal language generator comprises a universal language generator controller for accepting the entered tester independent characterizing information, DC testing parameters, AC testing parameters and AC test pattern choices; a DC universal language generator for generating the universal language instruction sequence for carrying out said DC parametric tests; and an AC universal language generator for generating the universal language instruction sequence for carrying out said AC parametric tests and AC pattern tests.

30. The system of claim 28 wherein each of said universal to tester translators includes an input manager for accepting the tester independent universal language instruction sequence; a DC setup generator for generating the tester dependent instruction sequence for carrying out said DC parametric tests; an AC setup generator for generating the tester dependent instruction sequence for carrying out said AC parametric tests; and a bit pattern generator for generating the tester dependent instruction sequence for carrying out said AC pattern tests.

31. The system of claim 24 further comprising a universal to tester translator selector for routing said tester independent universal language instruction sequence to the appropriate one of said plurality of universal to tester translators.

32. A method of automatically generating instruction sequences for testing one of a plurality of arrays of varying configurations solely on one of a plurality of array testers of varying designs by operating one or more computers to carry out the steps of:

providing means for entering tester independent test specifications for an array to be tested;

generating a tester independent universal language instruction sequence based upon the entered test specifications; and, translating the entirety of said tester independent universal language instruction sequence into a tester dependent instruction sequence which is compatible with the particular array tester to be employed;

whereby said tester dependent instruction sequence may be applied to the particular array tester to be employed, to thereby test said array thereon.

33. The method of claim 32 wherein said providing step comprises the step of presenting menus on a data entry device, for entry therein of tester independent test specifications for an array to be tested.

34. The method of claim 33 wherein said data entry device is an interactive data entry device.

35. The method of claim 32 wherein said tester independent test specifications comprise characterizing information, DC testing parameters, AC testing parameters and AC test pattern choices for said array.

36. The method of claim 32 wherein the following step is carried out between said menu presenting step and said generating step:

auditing the tester independent test specifications for completeness and consistency.

* * * * *